(12) United States Patent
Harada

(10) Patent No.: US 6,326,907 B1
(45) Date of Patent: Dec. 4, 2001

(54) CODING DEVICE

(75) Inventor: Hiroyuki Harada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/547,672

(22) Filed: Apr. 12, 2000

(30) Foreign Application Priority Data

Oct. 13, 1999 (JP) .................................................. 11-291164

(51) Int. Cl.$^7$ ...................................................... H03M 7/00
(52) U.S. Cl. .................................................. 341/51; 341/50
(58) Field of Search .............................. 341/50, 51, 67, 341/76; 375/244

(56) References Cited

U.S. PATENT DOCUMENTS 4,677,423 * 6/1987 Benvenuto et al. .......... 340/347 DD
5,825,310 * 10/1998 Tsutsui ................................... 341/51

OTHER PUBLICATIONS

"Computer Audio Processing", T. Akui et al., Jun. 10, 1980, Akiba Shuppan K. K., pp. 38–43.

"Introduction to A/D and D/A Conversion Circuit", I. Aira, Nov. 28, 1991, Nikkan Kogyo Shinbunsha, pp. 254–255.

* cited by examiner

*Primary Examiner*—Tuan T. Lam
(74) *Attorney, Agent, or Firm*—McDermott, Will & Emery

(57) ABSTRACT

A coding device using compression and expansion of digital data. Maximum values and minimum values of data are determined in each of predetermined N samples, and coding is performed by an orthogonal conversion computation unit which performs subtractions using the maximum value and the minimum value.

19 Claims, 22 Drawing Sheets

FIG.3

M=16bit K=4bit N=32samples

| No. | INPUT PCM (HEXADECIMAL) | INPUT PCM (DECIMAL) | MAXIMUM VALUE IN BLOCK | MINIMUM VALUE IN BLOCK | OUTPUT:4 BIT | DECODED DATA | DIFFERENCE BETWEEN INPUT AND DECODED DATA | |
|---|---|---|---|---|---|---|---|---|
| 1 | 0000 | 0 | 8231 | -8231 | 8 | 549 | 549 | |
| 2 | 0646 | 1606 | 8231 | -8231 | 9 | 1646 | 40 | |
| 3 | 0C4D | 3149 | 8231 | -8231 | 10 | 2744 | -405 | |
| 4 | 11DC | 4572 | 8231 | -8231 | 12 | 4939 | 367 | |
| 5 | 16BD | 5821 | 8231 | -8231 | 13 | 6036 | 215 | |
| 6 | 1ABC | 6844 | 8231 | -8231 | 14 | 7134 | 290 | |
| 7 | 1DB5 | 7605 | 8231 | -8231 | 14 | 7134 | -471 | |
| 8 | 1F89 | 8073 | 8231 | -8231 | 15 | 8231 | 158 | |
| 9 | 2027 | 8231 | 8231 | -8231 | 15 | 8231 | 0 | |
| 10 | 1F88 | 8072 | 8231 | -8231 | 15 | 8231 | 159 | |
| 11 | 1DB4 | 7604 | 8231 | -8231 | 14 | 7134 | -470 | |
| 12 | 1ABC | 6844 | 8231 | -8231 | 14 | 7134 | 290 | |
| 13 | 16BC | 5820 | 8231 | -8231 | 13 | 6036 | 216 | |
| 14 | 11DD | 4573 | 8231 | -8231 | 12 | 4939 | 366 | |
| 15 | 0C4E | 3150 | 8231 | -8231 | 10 | 2744 | -406 | |
| 16 | 0645 | 1605 | 8231 | -8231 | 9 | 1646 | 41 | FIRST BLOCK |
| 17 | 0001 | 1 | 8231 | -8231 | 8 | 549 | 548 | |
| 18 | F9BB | -1605 | 8231 | -8231 | 6 | -1646 | -41 | |
| 19 | F3B2 | -3150 | 8231 | -8231 | 5 | -2744 | 406 | |
| 20 | EE23 | -4573 | 8231 | -8231 | 3 | -4939 | -366 | |
| 21 | E943 | -5821 | 8231 | -8231 | 2 | -6036 | -215 | |
| 22 | E544 | -6844 | 8231 | -8231 | 1 | -7134 | -290 | |
| 23 | E24C | -7604 | 8231 | -8231 | 1 | -7134 | 470 | |
| 24 | E078 | -8072 | 8231 | -8231 | 0 | -8231 | -159 | |
| 25 | DFD9 | -8231 | 8231 | -8231 | 0 | -8231 | 0 | |
| 26 | E078 | -8072 | 8231 | -8231 | 0 | -8231 | -159 | |
| 27 | E24C | -7604 | 8231 | -8231 | 1 | -7134 | 470 | |
| 28 | E545 | -6843 | 8231 | -8231 | 1 | -7134 | -291 | |
| 29 | E944 | -5820 | 8231 | -8231 | 2 | -6036 | -216 | |
| 30 | EE24 | -4572 | 8231 | -8231 | 3 | -4939 | -367 | |
| 31 | F3B2 | -3150 | 8231 | -8231 | 5 | -2744 | 406 | |
| 32 | F9BA | -1606 | 8231 | -8231 | 6 | -1646 | -40 | |
| 33 | 0000 | 0 | 8231 | -8231 | 8 | 549 | 549 | |
| 34 | 0646 | 1606 | 8231 | -8231 | 9 | 1646 | 40 | |
| 35 | 0C4D | 3149 | 8231 | -8231 | 10 | 2744 | -405 | |
| 36 | 11DD | 4573 | 8231 | -8231 | 12 | 4939 | 366 | |
| 37 | 16BC | 5820 | 8231 | -8231 | 13 | 6036 | 216 | |
| 38 | 1ABB | 6843 | 8231 | -8231 | 14 | 7134 | 291 | |
| 39 | 1DB4 | 7604 | 8231 | -8231 | 14 | 7134 | -470 | |
| 40 | 1F89 | 8073 | 8231 | -8231 | 15 | 8231 | 158 | |
| 41 | 2027 | 8231 | 8231 | -8231 | 15 | 8231 | 0 | |
| 42 | 1F88 | 8072 | 8231 | -8231 | 15 | 8231 | 159 | |
| 43 | 1DB4 | 7604 | 8231 | -8231 | 14 | 7134 | -470 | |
| 44 | 1ABB | 6843 | 8231 | -8231 | 14 | 7134 | 291 | |
| 45 | 16BC | 5820 | 8231 | -8231 | 13 | 6036 | 216 | |
| 46 | 11DC | 4572 | 8231 | -8231 | 12 | 4939 | 367 | |
| 47 | 0C4D | 3149 | 8231 | -8231 | 10 | 2744 | -405 | |
| 48 | 0646 | 1606 | 8231 | -8231 | 9 | 1646 | 40 | SECOND BLOCK |
| 49 | 0000 | 0 | 8231 | -8231 | 8 | 549 | 549 | |
| 50 | F9BA | -1606 | 8231 | -8231 | 6 | -1646 | -40 | |
| 51 | F3B2 | -3150 | 8231 | -8231 | 5 | -2744 | 406 | |
| 52 | EE23 | -4573 | 8231 | -8231 | 3 | -4939 | -366 | |
| 53 | E944 | -5820 | 8231 | -8231 | 2 | -6036 | -216 | |
| 54 | E545 | -6843 | 8231 | -8231 | 1 | -7134 | -291 | |
| 55 | E24D | -7603 | 8231 | -8231 | 1 | -7134 | 469 | |
| 56 | E078 | -8072 | 8231 | -8231 | 0 | -8231 | -159 | |
| 57 | DFD9 | -8231 | 8231 | -8231 | 0 | -8231 | 0 | |
| 58 | E078 | -8072 | 8231 | -8231 | 0 | -8231 | -159 | |
| 59 | E24C | -7604 | 8231 | -8231 | 1 | -7134 | 470 | |
| 60 | E545 | -6843 | 8231 | -8231 | 1 | -7134 | -291 | |
| 61 | E945 | -5819 | 8231 | -8231 | 2 | -6036 | -217 | |
| 62 | EE24 | -4572 | 8231 | -8231 | 3 | -4939 | -367 | |
| 63 | F3B2 | -3150 | 8231 | -8231 | 5 | -2744 | 406 | |
| 64 | F9BA | -1606 | 8231 | -8231 | 6 | -1646 | -40 | |

FIG.19 (PRIOR ART)

| No. | INPUT PCM (HEXADECIMAL) | INPUT PCM (DECIMAL) | DIFFERENTIAL | STEP SIZE | OUTPUT ADPCM DATA | DIFFERENTIAL DECODING | DECODED DATA | DIFFERENCE BETWEEN INPUT AND DECODED DATA |
|---|---|---|---|---|---|---|---|---|
| 1 | 0000 | 0 | 0 | 1 | 0 | 0 | 0 | 0 |
| 2 | 0646 | 1606 | 1606 | 1 | 7 | 7 | 7 | -1599 |
| 3 | 0C4D | 3149 | 3142 | 2.4 | 7 | 16.8 | 23.8 | -3125.2 |
| 4 | 11DC | 4572 | 4548.2 | 5.76 | 7 | 40.32 | 64.12 | -4507.88 |
| 5 | 16BD | 5821 | 5756.88 | 13.824 | 7 | 96.768 | 160.888 | -5660.112 |
| 6 | 1ABC | 6844 | 6683.112 | 33.1776 | 7 | 232.2432 | 393.1312 | -6450.8688 |
| 7 | 1DB5 | 7605 | 7211.8688 | 79.62624 | 7 | 557.38368 | 950.51488 | -6654.48512 |
| 8 | 1F89 | 8073 | 7122.48512 | 191.102976 | 7 | 1337.720832 | 2288.235712 | -5784.764288 |
| 9 | 2027 | 8231 | 5942.764288 | 458.6471424 | 7 | 3210.529997 | 5498.765709 | -2732.234291 |
| 10 | 1F88 | 8072 | 2573.234291 | 1100.753142 | 2 | 2201.506284 | 7700.271992 | -371.7280077 |
| 11 | 1DB4 | 7604 | -96.27199232 | 990.6778276 | 0 | 0 | 7700.271992 | 96.27199232 |
| 12 | 1ABC | 6844 | -856.2719923 | 891.6100448 | -1 | -891.6100448 | 6808.661947 | -35.33805251 |
| 13 | 16BC | 5820 | -988.6619475 | 802.4490403 | -1 | -802.4490403 | 6006.212907 | 186.2129072 |
| 14 | 11DD | 4573 | -1433.212907 | 722.2041363 | -2 | -1444.408273 | 4561.804635 | -11.19536547 |
| 15 | 0C4E | 3150 | -1411.804635 | 649.9837227 | -2 | -1299.967445 | 3261.837189 | 111.8371892 |
| 16 | 0645 | 1605 | -1656.837189 | 584.9853504 | -3 | -1754.956051 | 1506.881138 | -98.11886205 |
| 17 | 0001 | 1 | -1505.881138 | 526.4868154 | -3 | -1579.460446 | -72.57930816 | -73.57930816 |
| 18 | F9BB | -1605 | -1532.420692 | 473.8381338 | -3 | -1421.514401 | -1494.09371 | 110.9062903 |
| 19 | F3B2 | -3150 | -1655.90629 | 426.4543204 | -4 | -1705.817282 | -3199.910991 | -49.91099145 |
| 20 | EE23 | -4573 | -1373.089009 | 383.8088884 | -4 | -1535.235554 | -4735.146545 | -162.1465451 |
| 21 | E943 | -5821 | -1085.853455 | 345.4279996 | -3 | -1036.283999 | -5771.430544 | 49.56945624 |
| 22 | E544 | -6844 | -1072.569456 | 310.8851996 | -3 | -932.6555988 | -6704.086143 | 139.9138574 |
| 23 | E24C | -7604 | -899.9138574 | 279.7966796 | -3 | -839.3900389 | -7543.476182 | 60.52381848 |
| 24 | E078 | -8072 | -528.5238185 | 251.8170117 | -2 | -503.6340234 | -8047.110205 | 24.88979512 |
| 25 | DFD9 | -8231 | -183.8897951 | 226.6353105 | -1 | -226.6353105 | -8273.745515 | -42.7455154 |
| 26 | E078 | -8072 | 201.7455154 | 203.9717795 | 1 | 203.9717795 | -8069.773736 | 2.226264065 |
| 27 | E24C | -7604 | 465.7737359 | 183.5746015 | 3 | 550.7238045 | -7519.049931 | 84.95006861 |
| 28 | E545 | -6843 | 676.0499314 | 165.2171414 | 4 | 660.8685655 | -6858.181366 | -15.18136593 |
| 29 | E944 | -5820 | 1038.181366 | 198.2605696 | 5 | 991.3028482 | -5866.878518 | -46.87851774 |
| 30 | EE24 | -4572 | 1294.878518 | 317.2169114 | 4 | 1268.867646 | -4598.010872 | -26.01087206 |
| 31 | F3B2 | -3150 | 1448.010872 | 380.6602937 | 4 | 1522.641175 | -3075.369697 | 74.63030275 |
| 32 | F9BA | -1606 | 1469.369697 | 456.7923524 | 3 | 1370.377057 | -1704.99264 | -98.99263991 |
| 33 | 0000 | 0 | 1704.99264 | 411.1131172 | 4 | 1644.452469 | -60.54017111 | -60.54017111 |
| 34 | 0646 | 1606 | 1666.540171 | 493.3357406 | 3 | 1480.007222 | 1419.467051 | -186.5329492 |
| 35 | 0C4D | 3149 | 1729.532949 | 444.0021666 | 4 | 1776.008666 | 3195.475717 | 46.47571711 |
| 36 | 11DD | 4573 | 1377.524283 | 532.8025999 | 3 | 1598.4078 | 4793.883517 | 220.8835168 |
| 37 | 16BC | 5820 | 1026.116483 | 479.5223399 | 2 | 959.0446798 | 5752.928197 | -67.07180341 |
| 38 | 1ABB | 6843 | 1090.071803 | 431.5701059 | 3 | 1294.710318 | 7047.638514 | 204.6385143 |
| 39 | 1DB4 | 7604 | 556.3614857 | 388.4130953 | 1 | 388.4130953 | 7436.05161 | -167.9483904 |
| 40 | 1F89 | 8073 | 636.9483904 | 349.5717858 | 2 | 699.1435716 | 8135.195181 | 62.19518122 |
| 41 | 2027 | 8231 | 95.80481878 | 314.6146072 | 0 | 0 | 8135.195181 | -95.80481878 |
| 42 | 1F88 | 8072 | -63.19518122 | 283.1531465 | 0 | 0 | 8135.195181 | 63.19518122 |
| 43 | 1DB4 | 7604 | -531.1951812 | 254.8378318 | -2 | -509.6756637 | 7625.519518 | 21.51951754 |
| 44 | 1ABB | 6843 | -782.5195175 | 229.3540487 | -3 | -688.062146 | 6937.457372 | 94.45737158 |
| 45 | 16BC | 5820 | -1117.457372 | 206.4186438 | -5 | -1032.093219 | 5905.364153 | 85.36415262 |
| 46 | 11DC | 4572 | -1333.364153 | 247.7023725 | -5 | -1238.511863 | 4666.85229 | 94.85228988 |
| 47 | 0C4D | 3149 | -1517.85229 | 297.2428471 | -5 | -1486.214235 | 3180.638055 | 31.63805459 |
| 48 | 0646 | 1606 | -1574.638055 | 356.6914165 | -4 | -1426.765666 | 1753.872389 | 147.8723887 |
| 49 | 0000 | 0 | -1753.872389 | 321.0222748 | -5 | -1605.111374 | 148.7610146 | 148.7610146 |
| 50 | F9BA | -1606 | -1754.761015 | 385.2267298 | -5 | -1926.133649 | -1777.372634 | -171.3726343 |
| 51 | F3B2 | -3150 | -1372.627366 | 462.2720757 | -3 | -1386.816227 | -3164.188862 | -14.18886157 |
| 52 | EE23 | -4573 | -1408.811138 | 416.0448682 | -3 | -1248.134605 | -4412.323466 | 160.6765339 |
| 53 | E944 | -5820 | -1407.676534 | 374.4403814 | -4 | -1497.761525 | -5910.084991 | -90.0849915 |
| 54 | E545 | -6843 | -932.9150085 | 336.9963432 | -3 | -1010.98903 | -6921.074021 | -78.07402115 |
| 55 | E24D | -7603 | -681.9259788 | 303.2967089 | -2 | -606.5934178 | -7527.667439 | 75.33256106 |
| 56 | E078 | -8072 | -544.3325611 | 272.967038 | -2 | -545.934076 | -8073.601515 | -1.601514956 |
| 57 | DFD9 | -8231 | -157.398485 | 245.6703342 | -1 | -245.6703342 | -8319.271849 | -88.27184916 |
| 58 | E078 | -8072 | 247.2718492 | 221.1033008 | 1 | 221.1033008 | -8098.168548 | -26.16854838 |
| 59 | E24C | -7604 | 494.1685484 | 198.9929707 | 2 | 397.9859414 | -7700.182607 | -96.18260696 |
| 60 | E545 | -6843 | 857.182607 | 179.0936736 | 5 | 895.4683682 | -6804.714239 | 38.28576122 |
| 61 | E945 | -5819 | 985.7142388 | 286.5498778 | 3 | 859.6496335 | -5945.064605 | -126.0646053 |
| 62 | EE24 | -4572 | 1373.064605 | 257.89489 | 5 | 1289.47445 | -4655.590155 | -83.59015515 |
| 63 | F3B2 | -3150 | 1505.590155 | 412.6318241 | 4 | 1650.527296 | -3005.062859 | 144.9371411 |
| 64 | F9BA | -1606 | 1399.062859 | 495.1581889 | 3 | 1485.474567 | -1519.588292 | 86.41170769 |

CODING DEVICE

FIELD OF THE INVENTION

The present invention relates to a high-efficiency coding device for compressing and expanding digital data. More particularly, this invention relates to a coding device in which there is no overload distortion or the like.

BACKGROUND OF THE INVENTION

FIG. 18 is a diagram showing the constitution of a coding device using a type of conventional coding method known as an adaptive differential pulse code modulation (hereinafter ADPCM) method. In FIG. 18, reference numeral 1 represents a data input terminal, 2 represents a data output terminal, and 3a and 3b represent adders. Reference numeral 4 represents a step size adaptation unit for determining a coding step size in the ADPCM method, and 5 represents a differential coding unit for coding differential data based on the step size determined by the step size adaptation unit 4. Reference numeral 6 represents a differential decoding unit for decoding differential data from the step size determined by the step size adaptation unit 4 and the data coded by the differential coding unit 5, and 7 represents a one-sample delay unit for holding data of one sampling time.

The operation of the conventional coding device shown in FIG. 18 will be explained below.

A coding device using an ADPCM method has the following two characteristic features. Firstly, it codes the differential value between present data to be coded and the immediately preceding data. Secondly, based on the result of coding the differential value, it adapts the step size so as to determine the step size in the next coding operation.

As a specific example, a case in which four bits of ADPCM data are obtained from sixteen bits of PCM data will be explained below.

The step size adaptation unit 4 performs the following processing to adapt the step size in accordance with data of the differential coding unit 5. Since the input data are coded as four bits of ADPCM data, there are sixteen values of coded data from −8 to 7. For instance, when the coded data is −8 or 7, a coefficient of 2.4 is applied to the step size. Similarly, a coefficient of 2 is applied when the coded data is −7 or 6, a coefficient of 1.6 is applied when the coded data is −6 or 5, a coefficient of 1.2 is applied when the coded data is −5 or 4, and a coefficient of 0.9 is applied in all other cases. When this calculation produces a step size which is less than a predetermined minimum step size value, the step size is set to the minimum step size value. Furthermore, when the step size that has been calculated exceeds a predetermined maximum step size value, the step size is set to the maximum step size value.

The differential coding unit 5 subtracts the output of the adder 3a from the step size determined by the step size adaptation unit 4. When the result of the subtraction is outside a range expressible by four bits, e.g. 8 or more, or −9 or less, a limit of 7 and −8 is respectively applied.

The differential decoding unit 6 multiplies the output of the differential coding unit 5 and the output of the step size adaptation unit 4.

FIG. 19 shows specific calculation processes carried out by the coding device using the ADPCM method shown in FIG. 18. The input data is in the form of a sin curve as shown in FIG. 20.

In FIG. 19, "No." represents the data number, "Input: PCM (hexadecimal)" is the PCM data input from the digital data input terminal 1 expressed in hexadecimal numbers. "Input: PCM (decimal)" is the value obtained by converting the hexadecimal data into decimal numbers. "Differential" is the output of the adding unit 3a. "Step size" represents the step size determined by the step size adaptation unit 4. "Output: ADPCM data" represents the ADPCM data which has been coded by the differential coding unit 5 and output from the ADPCM coding data output terminal 2. "Differential decode" represents the decoded value obtained by the differential decoding unit 6. "Decoded data" is the output of the adder 3b, and "Difference between input and decoded data" represents the difference between the input PCM data and the decoded value of the ADPCM coded data (aforementioned decoded data).

The calculation process of the specific example shown in FIG. 19 will be explained in sequence. This example refers to ADPCM coding, in which the initial value of the one-sample delay unit 7 is zero, and the initial value of the step size is 1. Furthermore, the minimum step size is 1, and the maximum step size is 4681.

In No. 1, since the input PCM value is zero and the initial value of the one-sample delay unit 7 is also zero, the output of the adder 3a is zero, and the output of the differential coding unit 5 (i.e. the output ADPCM data) is also zero. Further, the output of the differential decoding unit 6 is zero, and the decoded data is also zero. Prior to executing the data of No. 2, the step size adaptation unit 4 applies the coefficient of 0.9 (which is applied in all other cases as described above) to the initial value of 1. The result of this computation is 0.9, and since this is lower than the minimum step size value, the step size is set to a value of 1.

In No. 2, the input data is 1606, the value of the one-sample delay unit 7 is zero, the output of the adder 3a is 1606, and the output of the differential coding unit 5 is 7. Therefore, the output ADPCM data is also 7, the output of the differential decoding unit 6 is 7, and the output of the adder 3b is also 7. Consequently, the step size adapting unit 4 sets the step size to 2.4.

In No. 3, since the input is 3149 and the value of the one-sample delay unit 7 is 7, the output of the adder 3a is 3142, and the output of the differential coding unit 5 is 7. Therefore, the output ADPCM data is also 7, the output of the differential decoding unit 6 is 16.8, and the output of the adder 3b is 23.8. Consequently, the step size adaptation unit 4 sets the step size to 5.76. Subsequent computations are repeated in the same way, and further explanation will be omitted.

However, coding devices using the conventional ADPCM method described above have been known to suffer overload distortion and load distortion.

FIG. 21 shows decoded data obtained after coding the sin curve shown in FIG. 20 in a coding device using the conventional ADPCM method.

FIG. 22 shows the difference between the input data shown in FIG. 20 and the decoded data obtained by the ADPCM method shown in FIG. 21. As shown in FIG. 22, it is impossible to track the abrupt changes in the initial data, and a great distortion, known as overload distortion, occurs between the data from No. 1 to No. 11.

SUMMARY OF THE INVENTION

The present invention has been achieved in light of the problem of an inability to sufficiently track abrupt changes in the input data. It is an object of the present invention to provide a coding device in which no overload distortion occurs.

According to the present invention, input data is arranged into blocks, a maximum value MAX and a minimum value MIN in that block are determined. An orthogonal conversion computation unit subtracts the differential value of the maximum value MAX and the minimum value MIN from the input data, and then a coding unit performs coding the value calculated by the orthogonal conversion computation unit into desired bits. Therefore, coding can be achieved without overload distortion.

Other objects and features of this invention will become apparent from the following description with reference to the accompanying drawings.

BRIEF DESCRIPTION OF THE DRAWINGS

FIG. 3 is a diagram showing a computation process in an orthogonal conversion computation unit according to the first embodiment;

FIG. 19 is a diagram showing a computation process in a conventional coding device;

DESCRIPTION OF THE PREFERRED EMBODIMENTS

A first embodiment of the present invention will be explained below.

Figure 1:
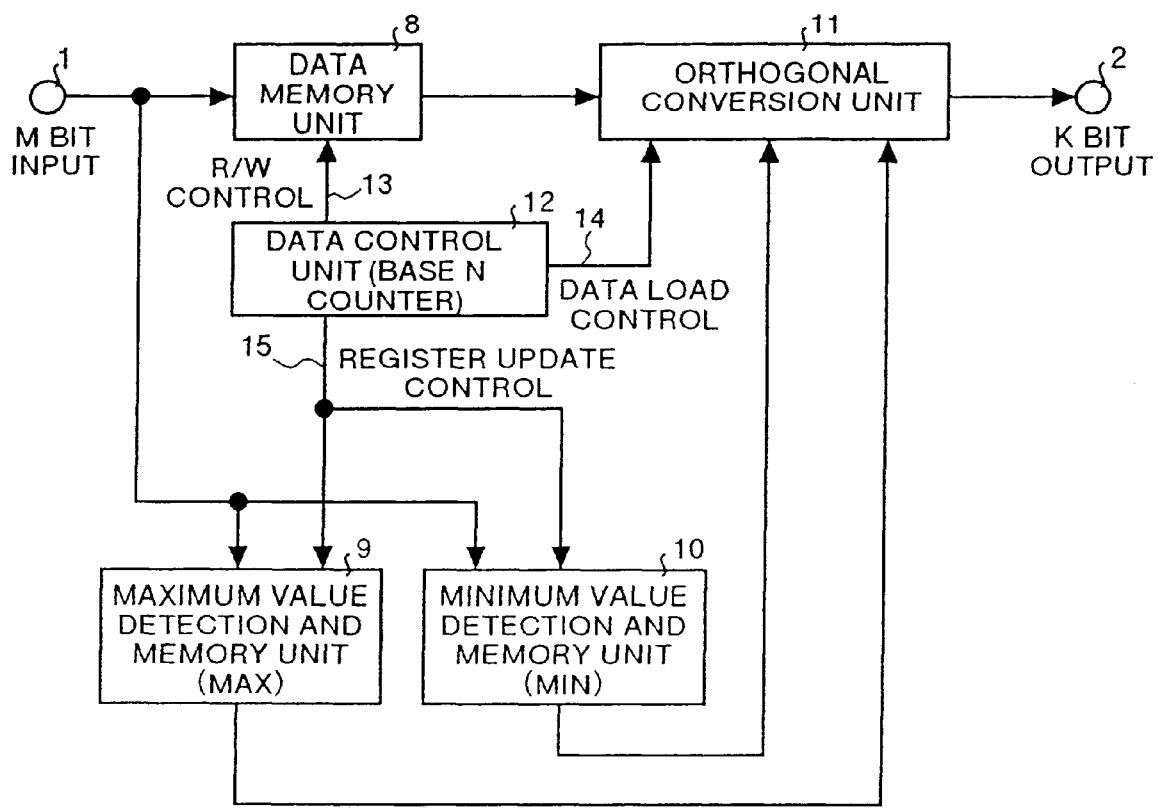
FIG. 1 is a block diagram of a coding device according to a first embodiment.

FIG. 1 is a block diagram showing a coding device according to the first embodiment of the present invention.

In FIG. 1, reference numeral 1 represents an input terminal for inputting M-bit digital data, and reference numeral 2 represents an output terminal for outputting K-bit data coded by the coding device of the present invention. Reference numeral 8 represents a data memory unit for storing N samples of the M-bit data, and reference numeral 9 represents a maximum value detection memory unit for detecting and holding a maximum value MAX from the data memory unit 8. Reference numeral 10 represents a minimum value detection memory unit for detecting and holding a minimum value MIN from the data memory unit 8, and reference numeral 11 represents an orthogonal conversion computation unit for coding data through a predetermined computation. Reference numeral 12 represents a data control unit comprises a base N counter, and reference numeral 13 represents a read/write control lead for sending a read/write control signal from the data control unit 12 to the data memory unit 8. Reference numeral 14 represents a data load control lead for sending a data load control signal from the data control unit 12 to the orthogonal conversion computation unit 11. Reference numeral 15 represents a register update control signal lead for sending a register update control signal from the data control unit 12 to the maximum value detection memory unit 9 and the minimum value detection memory unit 10.

Figure 2:
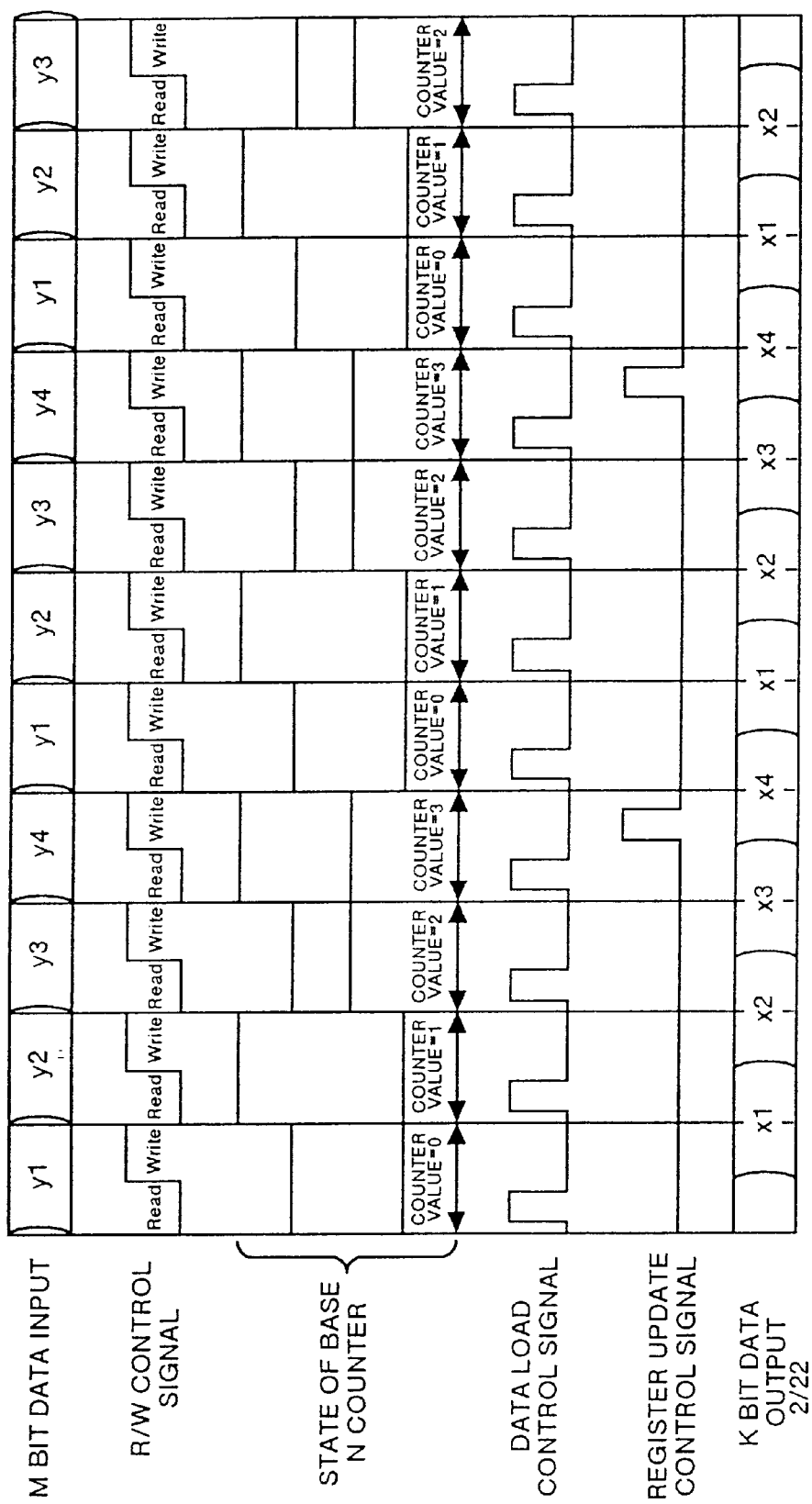
FIG. 2 is a timing table explaining the operation of the coding device according to the first embodiment.

The operation of the coding device of FIG. 1 in a case where the data number of one block is 4 will be explained with reference to FIG. 2. Furthermore, to simplify the explanation, all the registers are in the initialized state.

The N-base counter repeats a value of 0 to 3, and while the counter is 1, a read/write control signal controls reading in the first half and writing in the second half.

A first data y1 is input from the input terminal 1, and when the first position from the data memory unit 8 has been read out by the orthogonal conversion computation unit 11, the data y1 is written into the first position of the data memory unit 8. Similarly, the second data y2 to the fourth data y4 are read out and written in. The length of these data is one M bit.

The maximum value detection memory unit 9 detects the maximum value MAX among the first data y1 to the fourth data y4, and the minimum value detection memory unit 10 detects the minimum value MIN among the first data y1 to the fourth data y4. When the register update control signal reaches the H level, the detected maximum value MAX and the minimum value MIN are held, and the detection of the maximum value MAX and the minimum value MIN is initialized.

When the data load control signal reaches the H level, the orthogonal conversion computation unit 11 loads the data output from the data memory unit 8 during the period when the read/write control signal is at the L level, the maximum value MAX held by the maximum value detection memory unit 9, and the minimum value MIN held by the minimum value detection memory unit 10. Then, the orthogonal conversion computation unit 11 carries out a predetermined computation, and outputs K-bit coded data x1 to x4 from its output terminal 2.

The operation of the orthogonal conversion computation unit 11 will be explained.

Here, the operation in an example in which the coding device of the present invention obtains four bits of data from sixteen bits of PCM data input thereto will be explained. Moreover, in this example, the data number N in one block=32 samples.

First, the input terminal 1 inputs the data of No. 1 to No. 32, and these are stored in the data memory unit 8. These 32 samples form one block, and the orthogonal conversion computation unit 11 performs an orthogonal conversion computation. Furthermore, the minimum value detection memory unit 10 detects and holds the minimum value MIN among the 32 samples stored in the data memory unit 8. Here, MIN=−8231. Similarly, the maximum value detection memory unit 9 detects and holds the maximum value MAX among the 32 samples stored in the data memory unit 8. Here, MAX=8231.

Next, desired individual data values Yn ($1 \leq n \leq 32$) are read out sequentially from the data memory unit 8, and the computation below is carried out. The result is rounded off to determine four bits of computed data Xn.

The equation (1) is as follows:

$$(Y_n - MIN) \times (2^K - 1)/(MAX - MIN) = X_n \tag{1}$$

FIG. 3 shows the computation process for coding used in the first embodiment of the present invention described above.

In FIG. 3, the reference symbol No. represents the input data number; symbol "input: PCM (base sixteen)" represents sixteen bits of PCM data input from the input terminal 1 expressed in base sixteen; symbol "input: PCM (base ten)" represents the base sixteen data converted to base ten; the "maximum value MAX in the block" represents the maximum value MAX in each group of 32 samples; the "minimum value MIN in the block" represents the minimum value MIN in each group of 32 samples; "output: four bits" represents data coded by the orthogonal conversion computation unit 11 and output from the output terminal 2; "decoded data" represents decoded values obtained by performing the coding process in reverse; and "difference between input and decoded data" represents the difference between the input PCM data and the data which has been coded by the coding device of the present invention.

The processes of computation and coding will be explained according to FIG. 3.

First, the input terminal 1 inputs the data of No. 1 to No. 32, and these are stored in the data memory unit 8. These N=32 samples form one block, and the coding computation is carried out. Further, the maximum value detection memory unit 9 detects and holds the maximum value MAX among the 32 samples stored in the data memory unit 8. Here, MAX=8231. Similarly, the minimum value detection memory unit 10 detects and holds the minimum value MIN among the 32 samples stored in the data memory unit 8. Here, MIN=−8231.

Desired data values Yn ($1 \leq n \leq 32$) are read out sequentially from the data memory unit 8, and the following computation is carried out using the equation (1). Assuming that four-bit coding is to be carried out, the equation is (Yn −MIN)×($2^4$−1)/(MAX−MIN). The result of this computation is rounded off to the nearest integer and coded in four bits. In No. 1, (0−(−8231))=15/(8231−(−8231)) produces a result of 7.5. When this is rounded off to 8, a four-bit output of 1000 is obtained. Decoding can be achieved by reversing this computation. In the case of No. 1, the decoding computation is 8×(8231−(−8231))/15+(−8231), giving a result of 548.7333 . . . . In this table, this value is rounded off to 549.

Coding and decoding can be performed by repeating the computation in the same way.

Figure 4:
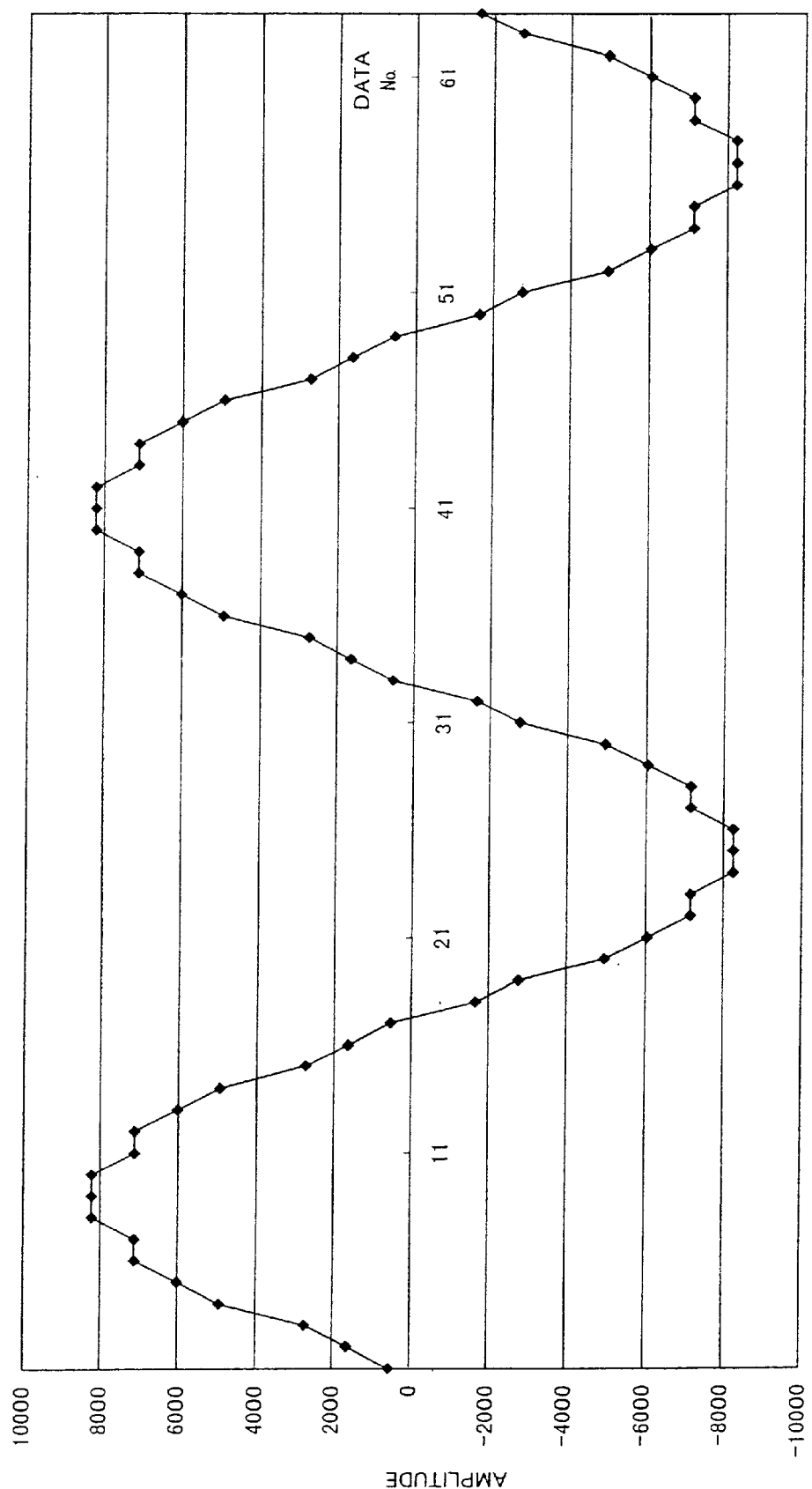
FIG. 4 is a graph showing computation results in the orthogonal conversion computation unit according to the first embodiment.
Figure 20:
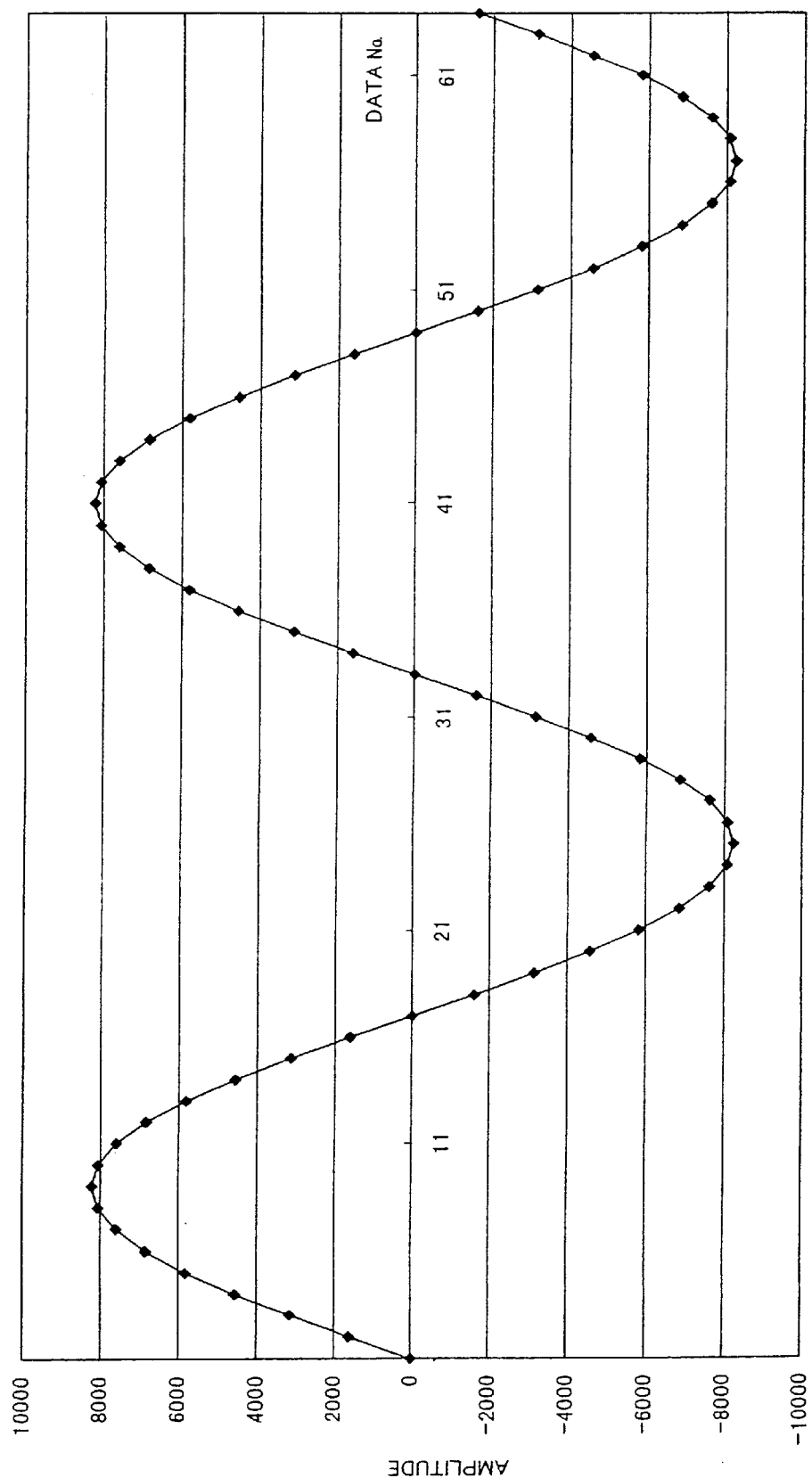
FIG. 20 is a graph showing sin curve data as an example of input data in the conventional device and the present embodiment.
Figure 21:
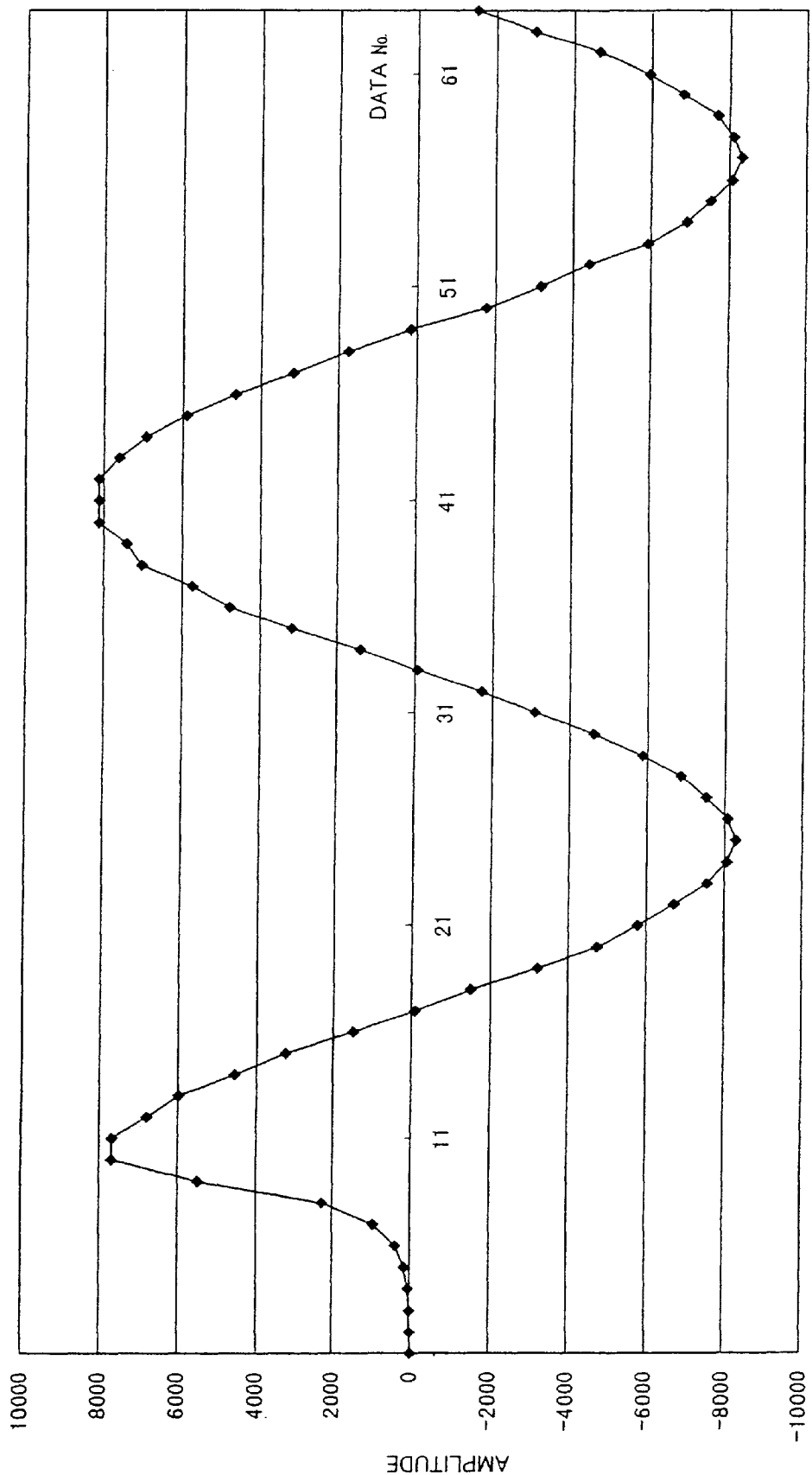
FIG. 21 is a graph showing a computation result in the conventional coding device.

FIG. 4 shows the decoded data of FIG. 3 in graph form. Further, FIG. 5 shows the difference between the decoded data of FIG. 4 and the input data of FIG. 20.

Figure 5:
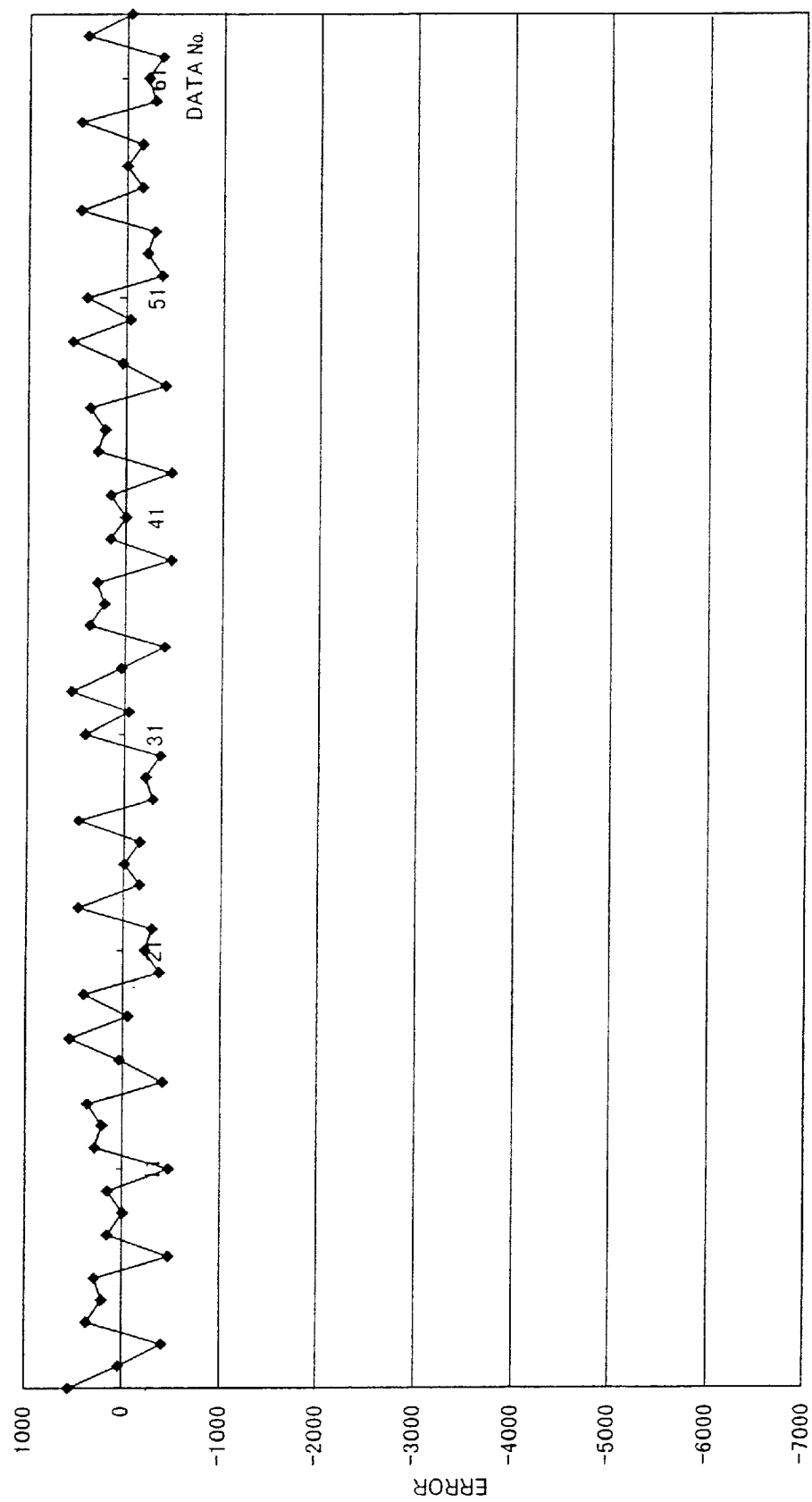
FIG. 5 is a graph showing a comparison between input data and computation result in the orthogonal conversion computation unit according to the first embodiment.
Figure 22:
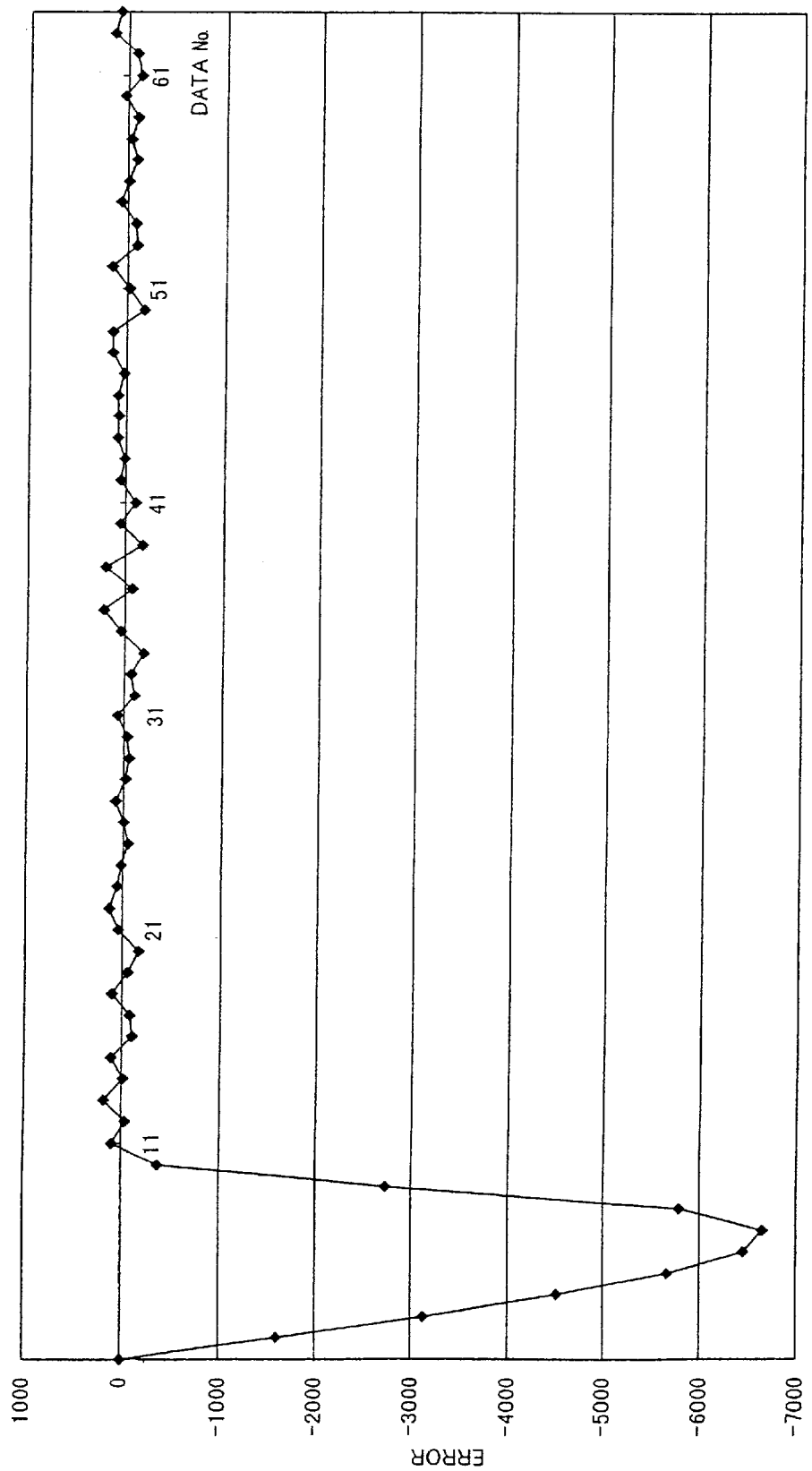
FIG. 22 is a graph showing a comparison between input data and a computation result in a conventional coding device.

As shown in FIGS. 4 and 5, the overload distortion, described in the conventional art and shown in FIG. 22, is greatly improved.

Similar effects can be obtained by replacing the equation (1) of the first embodiment with the following equation (2). This is the second embodiment of the present invention.

$$(Y_n - MIN) \times (N-1)/(MAX - MIN) = X_n \tag{2}$$

In the same way as the first embodiment shown in FIG. 3, for the data Y1=0 in No. 1, the computation (0−(−8231))× 31/(8231−(−8231)) is performed to produce a value X1 of 15.5. This result is coded by a given bit number K.

For instance, when K=5 and only the integer portion of the computation result is coded, the computation result is first rounded off to 16, obtaining a five-bit output of 10000.

Alternatively, when K=6 and five bits are allocated to the integer portion of the computation result, and one bit is allocated to the fractional portion, a six-bit output of 011111 is obtained.

Here, decoding can be achieved by reversing this computation. For instance, when K=5, the decoding computation is 16×(8231−(−8231)/31+(−8231), giving a result of 265.516. Furthermore, when K=6, a computation of 15.5× (8231−(−8231)/31+(−8231) gives a result of 0.

By similarly repeating these computations sequentially from the data Y2=1606 of No. 2, coding and decoding can be performed in the same way as in the first embodiment. Therefore, a detailed explanation of the computations after No. 2 is omitted here.

In the second embodiment, as in the first embodiment, overload distortion is greatly improved in comparison with the conventional example.

Similar effects can be obtained by replacing the equation (1) of the first embodiment with the following equation (3). This is the third embodiment of the present invention.

$$(Y_n - MAX) - (N-1)/(MIN - MAX) = X_n \tag{3}$$

In the same way as FIG. 3 of the first embodiment, for the data Y1=0 in No. 1, the computation (0−8231)×31/(−8231− 8231) is performed to produce a value X1 of 15.5. This result is coded by a given bit number K.

For instance, when K=5 and only the integer portion of the computation result is coded, the computation result is first rounded off to 16, obtaining a five-bit output of 10000.

Further, when K=6 and five bits are allocated to the integer portion of the computation result, and one bit is allocated to the fractional portion, a six-bit output of 011111 is obtained.

Here, decoding can be achieved by reversing this computation. For instance, when K=5, the decoding computation is 16×(−8231−8231))/31+8231, giving a result of −265.516. Furthermore, when K=6, a computation of 15.5×(−8231− 8231)) /31+8231 gives a result of 0.

By similarly repeating these computations sequentially from the data Y2=1606 of No. 2, coding and decoding can be performed in the same way as in the first embodiment. Therefore, a detailed explanation of the computations after No. 2 is omitted here.

In the third embodiment, as in the first embodiment, overload distortion is greatly improved in comparison with the conventional example.

Similar effects can be obtained by replacing the equation (1) of the first embodiment with the following equation (4). This is the fourth embodiment of the present invention.

$$(Y_n-MAX)\times(2^K-1)/(MIN-MAX)=X_n \quad (4)$$

In the same way as FIG. 3 of the first embodiment, for he data Y1=0 in No. 1, the computation (0−8231)×15/(−8231 8231) is performed to produce a value X1 of 7.5. This result is coded by a given bit number K.

For instance, when K=4, the computation result is rounded off to 8, which is then coded to obtain an output of 1000.

Here, decoding can be achieved by reversing this computation to 8×(−8231−8231)/15+8231, giving a result of −548.7333.

By similarly repeating these computations sequentially from the data Y2=1606 of No. 2, coding and decoding can be performed in the same way as in the first embodiment. Therefore, a detailed explanation of the computations after No. 2 is omitted here.

In the fourth embodiment, as in the first embodiment, overload distortion is greatly improved in comparison with the conventional example.

Figure 6:
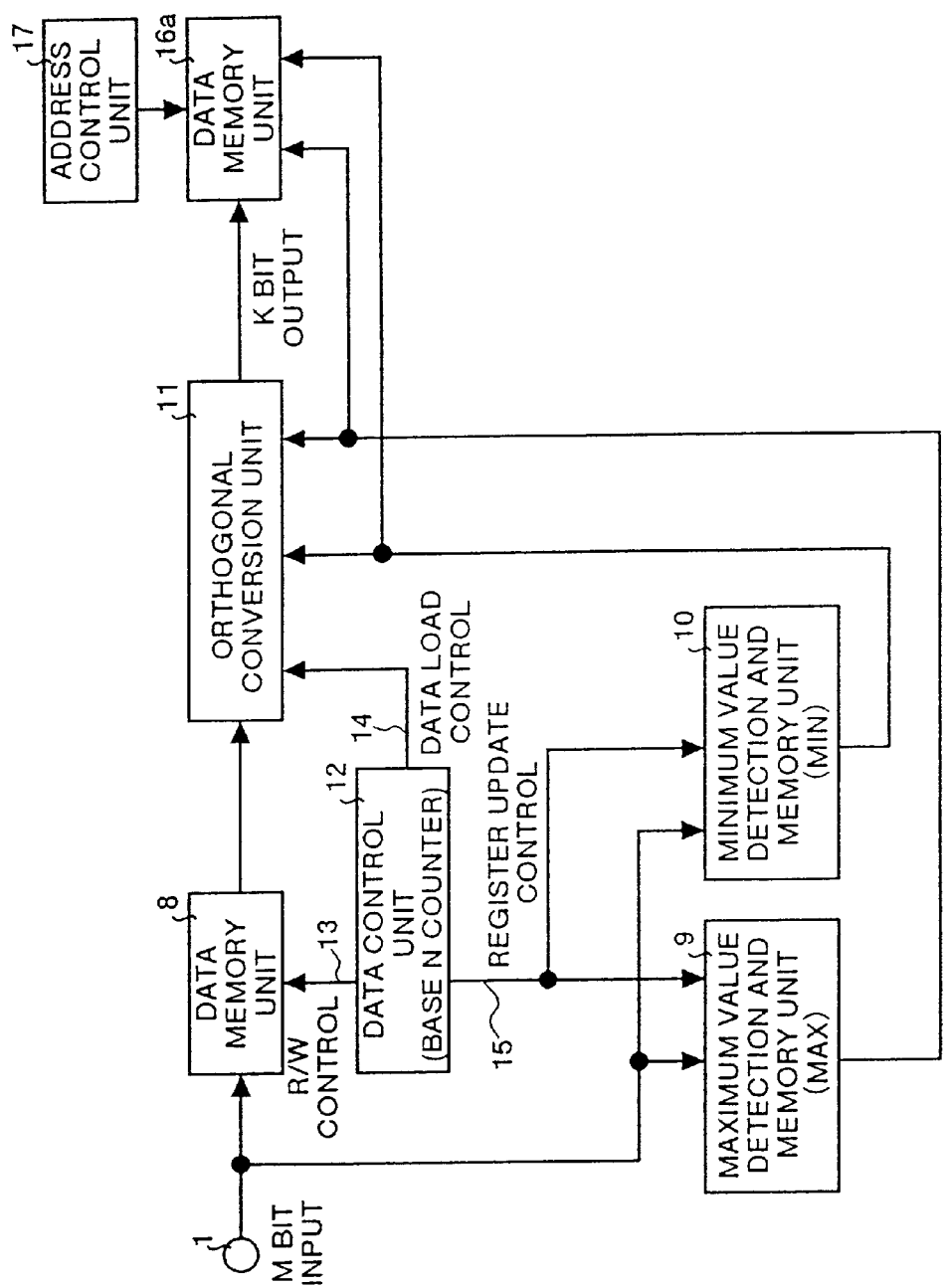
FIG. 6 is a block diagram showing a coding device according to a fifth embodiment.

FIG. 6 shows a coding device according to the fifth embodiment.

The present embodiment differs from the one shown in FIG. 1 in that it further comprises data a memory unit 16a, capable of storing MAX values, MIN values, and computation values Xn of N samples coded in K bits for each block in a given number L of blocks, and an address control unit 17 for controlling the memory addresses of the data memory unit 16a.

A MAX1 and a MIN1 for the data of the first block (i.e. the data group of the first N sample) are stored in the data memory unit 16a at an address specified by the address control unit 17, and computation values Xn of the N samples ($1 \leq n \leq N$) are coded in K bits by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced.

Figure 7:
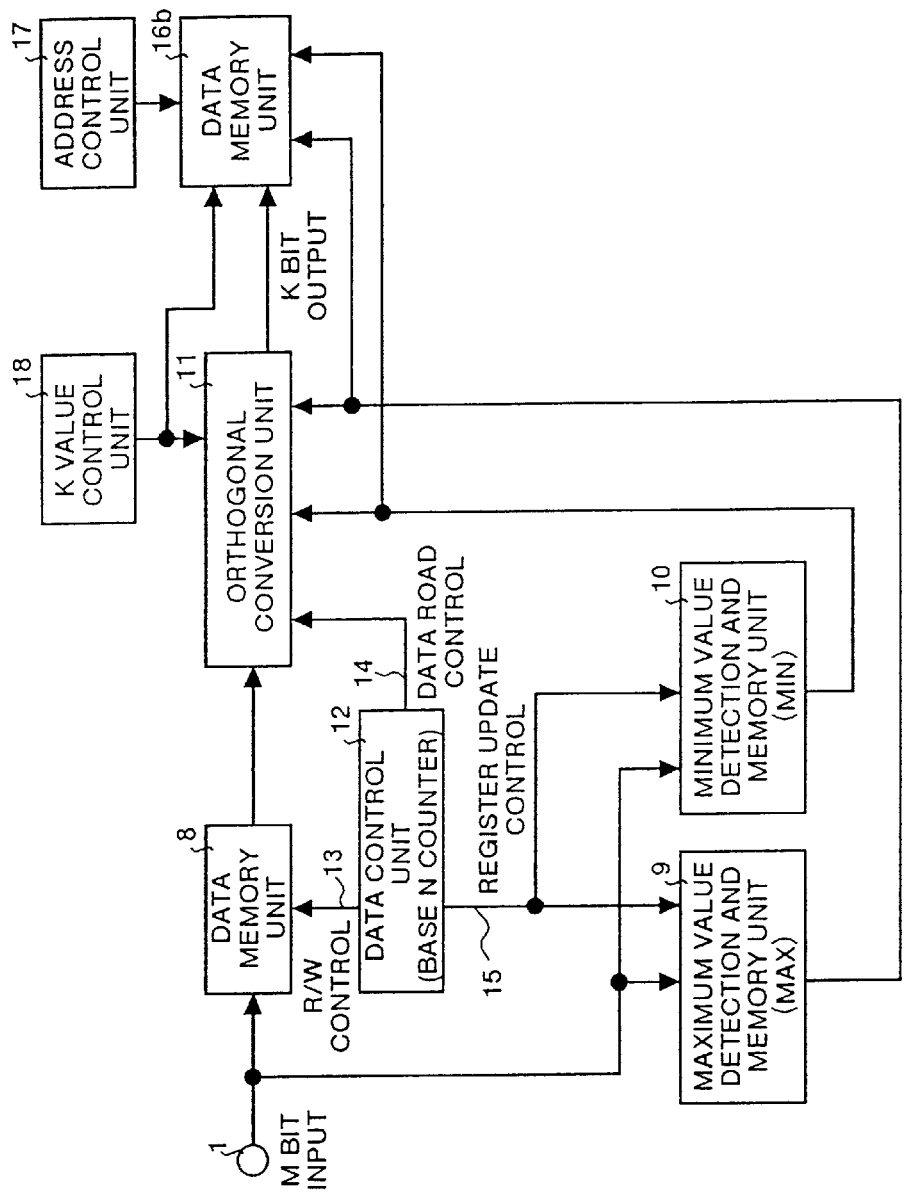
FIG. 7 is a block diagram showing a coding device according to a sixth embodiment.

FIG. 7 shows a coding device according to the sixth embodiment.

The sixth embodiment differs from the one shown FIG. 1 in that it further comprises a data memory unit 16b, capable of storing MAX values, MIN values, K values, and computation values Xn of N samples coded in K bits for each block in a given number L of blocks, an address control unit 17 for controlling the memory addresses of the data memory unit 16b, and a K value control unit 18 for controlling the K value of each block.

MAX1, MIN1, and K1 for the data of the first block (i.e. the data group of the first N sample) are stored in the data memory unit 16b at an address specified by the address control unit 17, and computation values Xn of the N samples ($1 \leq n \leq N$) are coded in K bits by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced. In addition, it is possible to change the K value of each block, thereby making it easy to reduce and increase the number of data.

Figure 8:
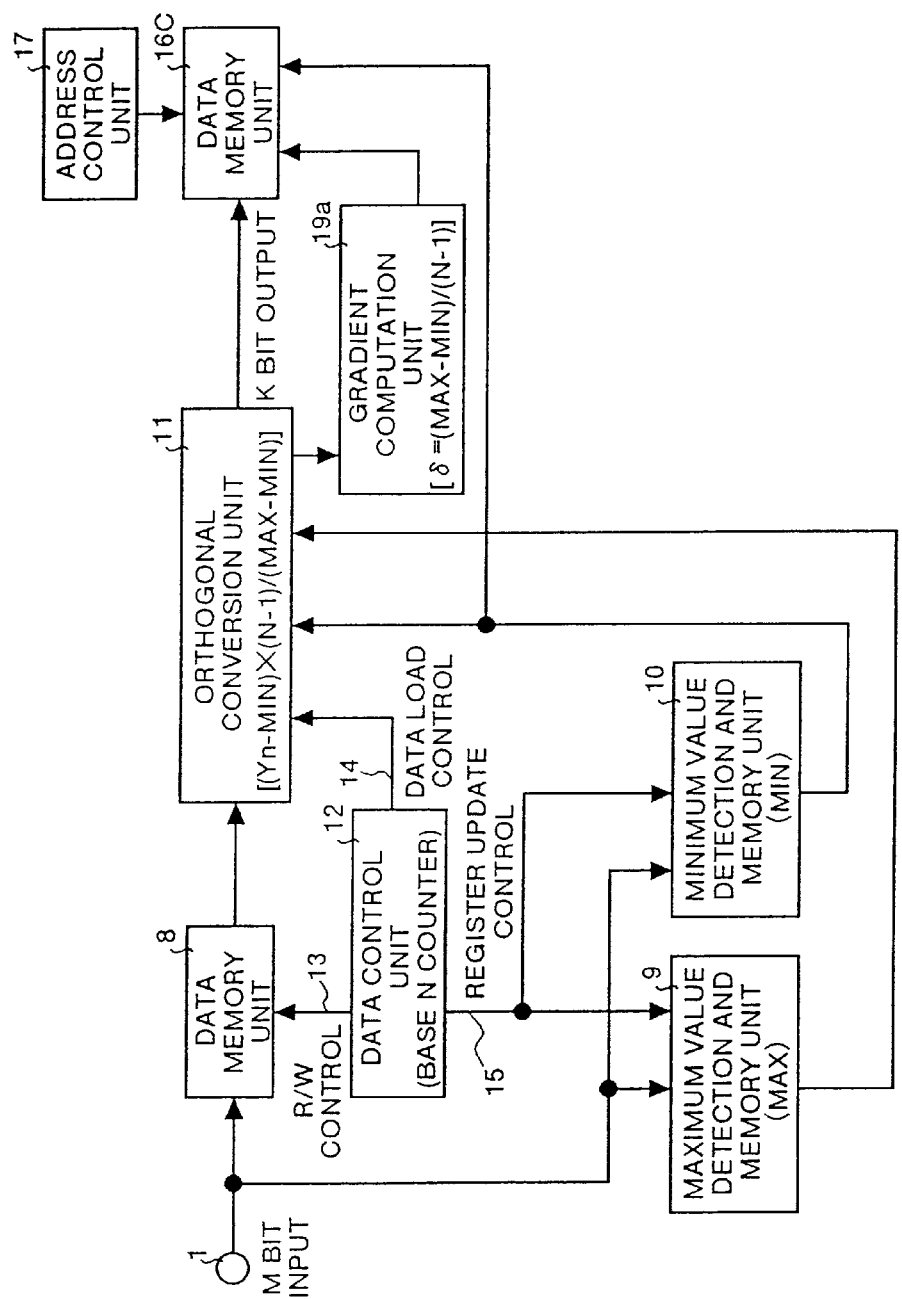
FIG. 8 is a block diagram showing a coding device according to a seventh embodiment.

FIG. 8 shows a coding device according to the seventh embodiment.

The present embodiment differs from the one shown in FIG. 1 in that it further comprises a data memory unit 16c, capable of storing MIN values, a gradient δ calculated by (MAX−MIN)/(N−1), computation values Xn of N samples coded in K bits for each block in a given number L of blocks, an address control unit 17 for controlling the memory addresses of the data memory unit 16c, and a gradient computation unit 19a for calculating the gradient δ using the computation (MAX−MIN)/(N−1). A MIN1, and a gradient δ1 obtained by the computation (MAX1−MIN1)/(N−1), for the data of the first block (i.e. the data group of the first N sample) are stored in the data memory unit 16c at an address specified by the address control unit 17, and computation values Xn of the N samples ($1 \leq n \leq N$) are coded in K bits using the equation (2) mentioned above by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced.

Figure 9:
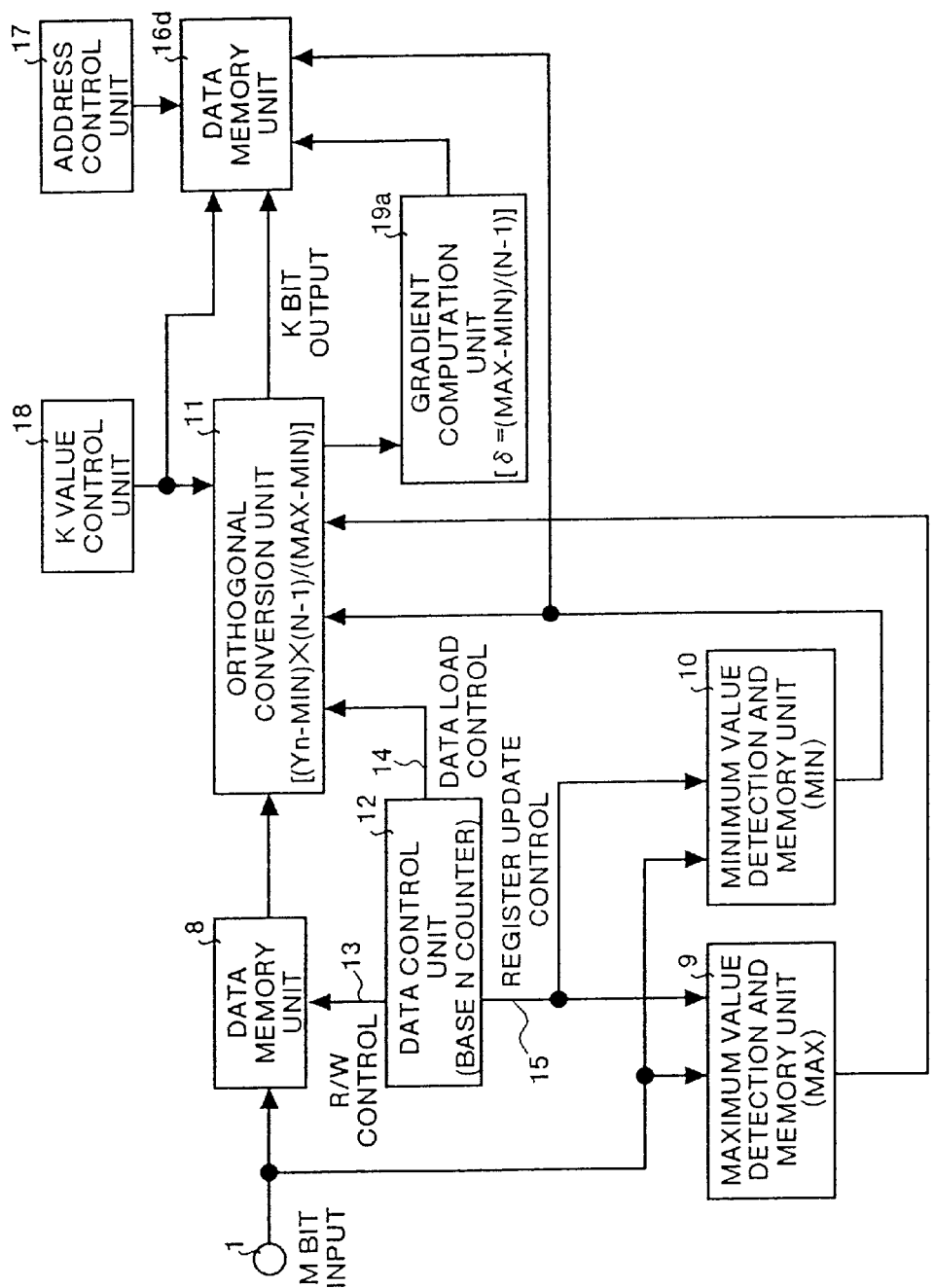
FIG. 9 is a block diagram showing a coding device according to an eighth embodiment.

FIG. 9 shows a coding device according to the eighth embodiment.

The present embodiment differs from the one shown in FIG. 1 in that it comprises a data memory unit 16d, capable of storing MIN values, K values, a gradient δ calculated by (MAX−MIN)/(N−1), and computation values Xn of N samples coded in K bits for each block in a given number L of blocks, an address control unit 17 for controlling the memory addresses of the data memory unit 16d, a gradient computation unit 19a for calculating the gradient δ using the computation (MAX−MIN)/(N−1), and a K value control unit 18 for controlling the K value of each block. MIN1, K1, and gradient δ1 obtained by the computation (MAX1−MIN1)/(N−1) for the data of the first block (i.e. the data group of the first N sample) are stored in the data memory unit 16d at an address specified by the address control unit 17, and computation values Xn of the N samples ($1 \leq n \leq N$) are coded in K bits using the equation (2) mentioned above by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced. In addition, it is possible to change the K value of each block, thereby making it easy to reduce and increase the number of data.

Figure 10:
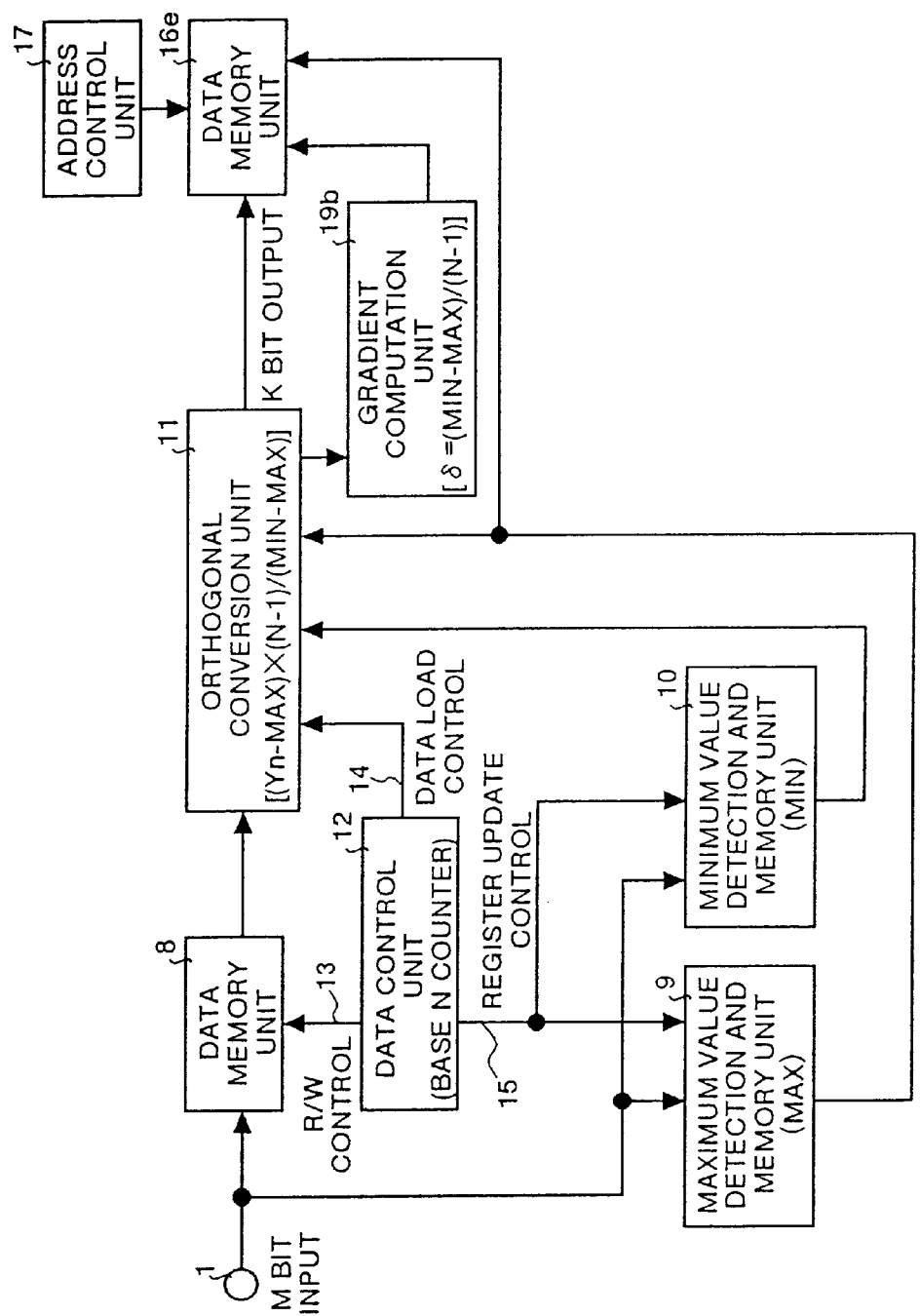
FIG. 10 is a block diagram showing a coding device according to a ninth embodiment.

FIG. 10 shows a coding device according to the ninth embodiment.

The present embodiment differs from the one shown in FIG. 1 in that it further comprises a data memory unit 16e, capable of storing MAX values, a gradient δ calculated by (MIN−MAX)/(N−1), and computation values Xn of N samples coded in K bits for each block in a given number L of blocks, an address control unit 17 for controlling the memory addresses of the data memory unit 16e, and a gradient computation unit 19b for calculating the gradient δ using the computation (MIN−MAX)/(N−1).

A MAX1, and a gradient δ1 obtained by the computation (MIN1−MAX1)/(N−1), for the data of the first block (i.e. the data group of the first N sample) are stored in the data memory unit 16e at an address specified by the address control unit 17, and computation values Xn of the N samples ($1 \leq n \leq N$) are coded in K bits using the equation (3) mentioned above by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced.

Figure 11:
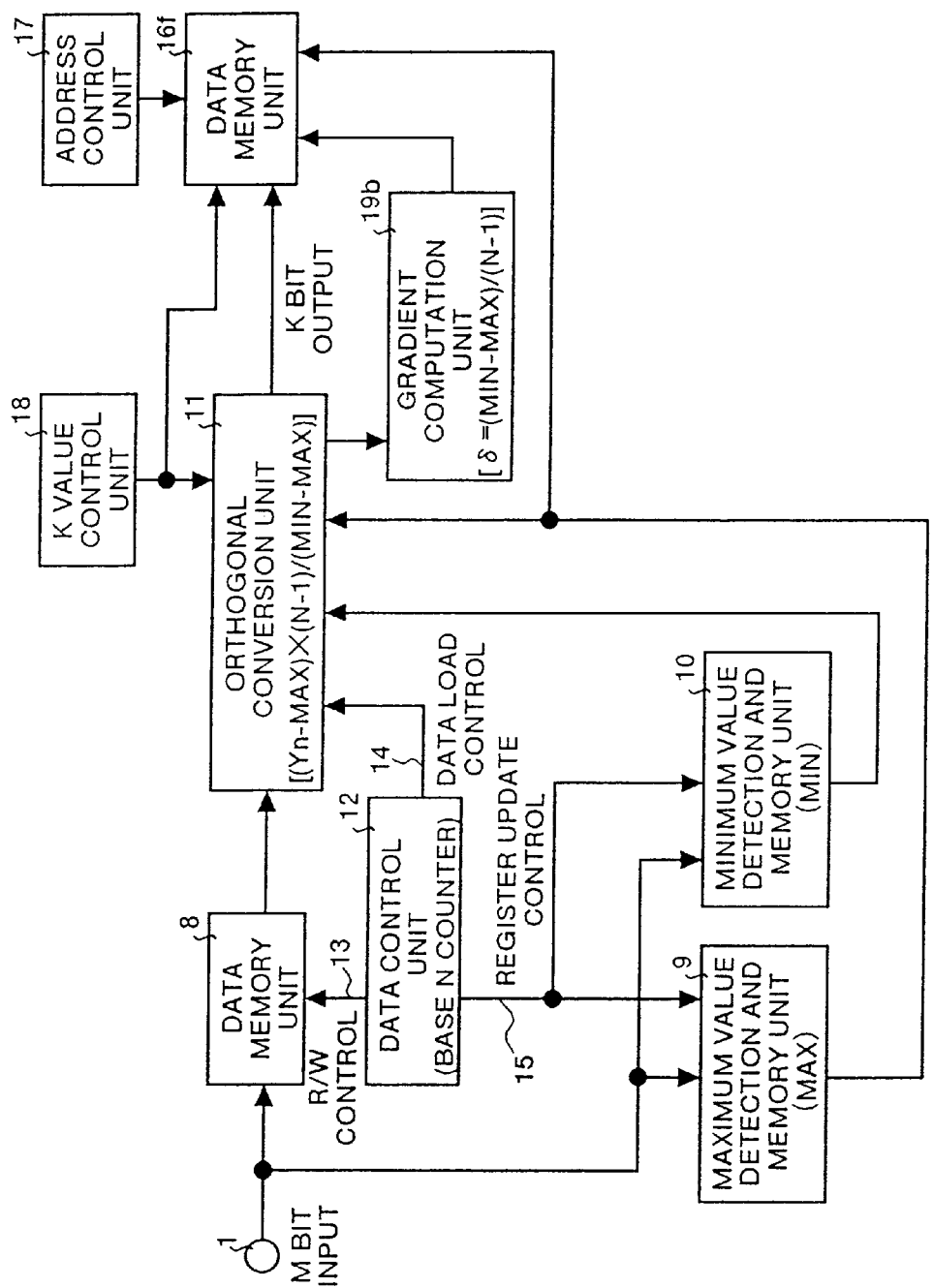
FIG. 11 is a block diagram showing a coding device according to a tenth embodiment.

FIG. 11 shows a coding device according to the tenth embodiment.

The present embodiment differs from the one shown in FIG. 1 in that it further comprises a data memory unit 16f, capable of storing MAX values, K values, a gradient δ calculated by (MIN−MAX)/(N−1), and computation values Xn of N samples coded in Kbits for each block in a given number L of blocks, an address control unit 17 for controlling the memory addresses of the data memory unit 16f, and a gradient computation unit 19b for calculating the gradient δ using the computation (MIN−MAX)/(N−1), and a K value control unit 18 for controlling the K value of each block.

MAX1, K1, and gradient δ1 obtained by the computation (MIN1−MAX1)/(N−1), for the data of the first block (i.e. the data group of the first N sample) are stored in the data memory unit 16f at an address specified by the address control unit 17, and computation values Xn of the N samples ($1 \leq n \leq N$) are coded in K bits using the equation (3) mentioned above by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced. In addition, it is possible to change the K value of each block, thereby making it easy to reduce and increase the number of data.

Figure 12:
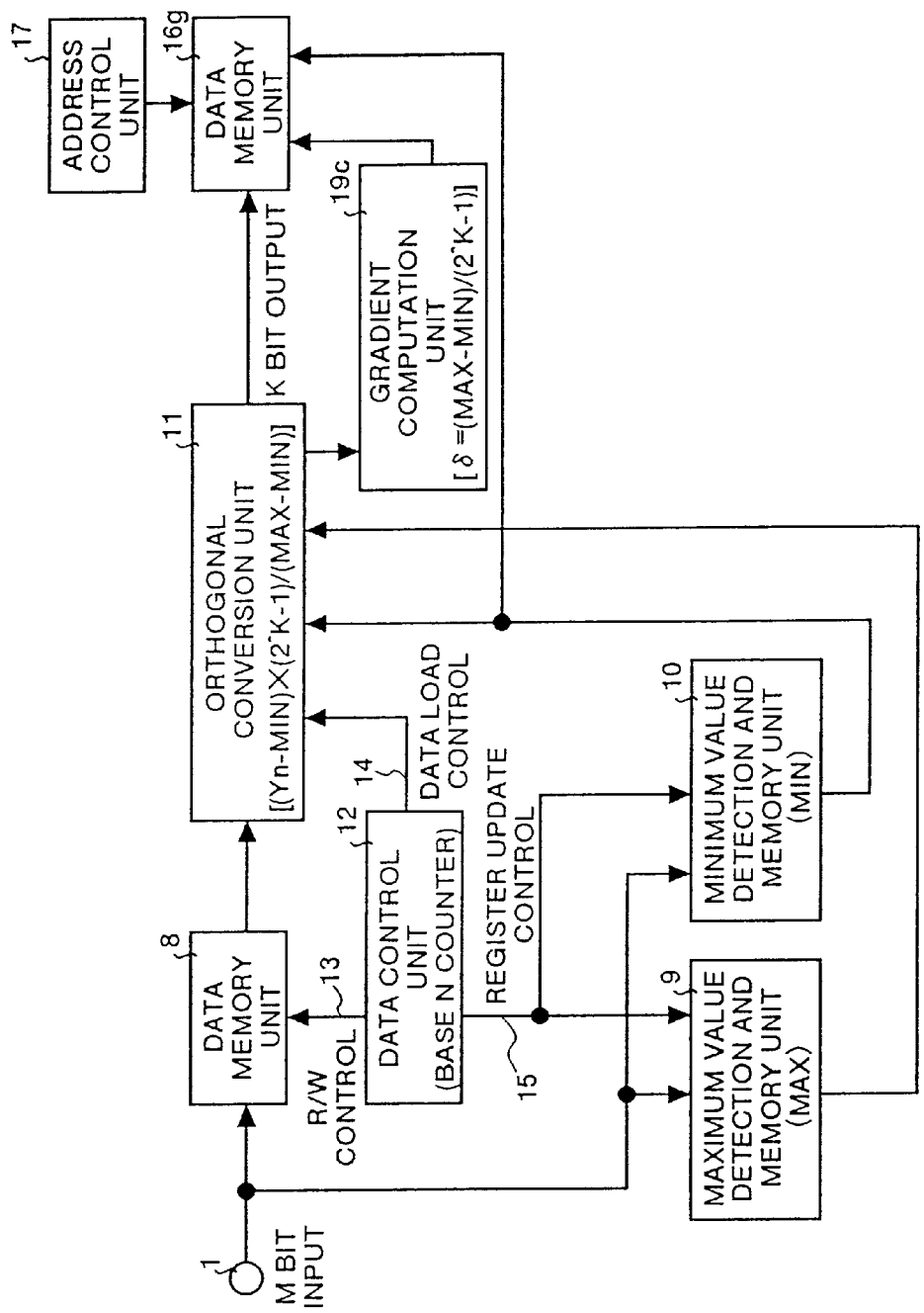
FIG. 12 is a block diagram showing a coding device according to an eleventh embodiment.

FIG. 12 shows a coding device according to the eleventh embodiment.

The present embodiment differs from the one shown in FIG. 1 in that it comprises a data memory unit 16g, capable of storing MIN values, a gradient δ calculated by (MAX−MIN)/($2^K$−1), and computation values Xn of N samples coded in K bits for each block in a given number L of blocks, an address control unit 17 for controlling the memory addresses of the data memory unit 16g, and a gradient computation unit 19c for calculating the gradient δ using the computation (MAX−MIN)/($2^K$−1).

A MIN1 and a gradient δ1 obtained by the computation (MAX1−MIN1)/($2^K$−1) for the data of the first block (i.e. the data group of the first N sample) are stored in the data memory unit 16g at an address specified by the address control unit 17, and computation values Xn of the N samples ($1 \leq n \leq N$) are coded in K bits using the equation (1) mentioned above by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced.

Figure 13:
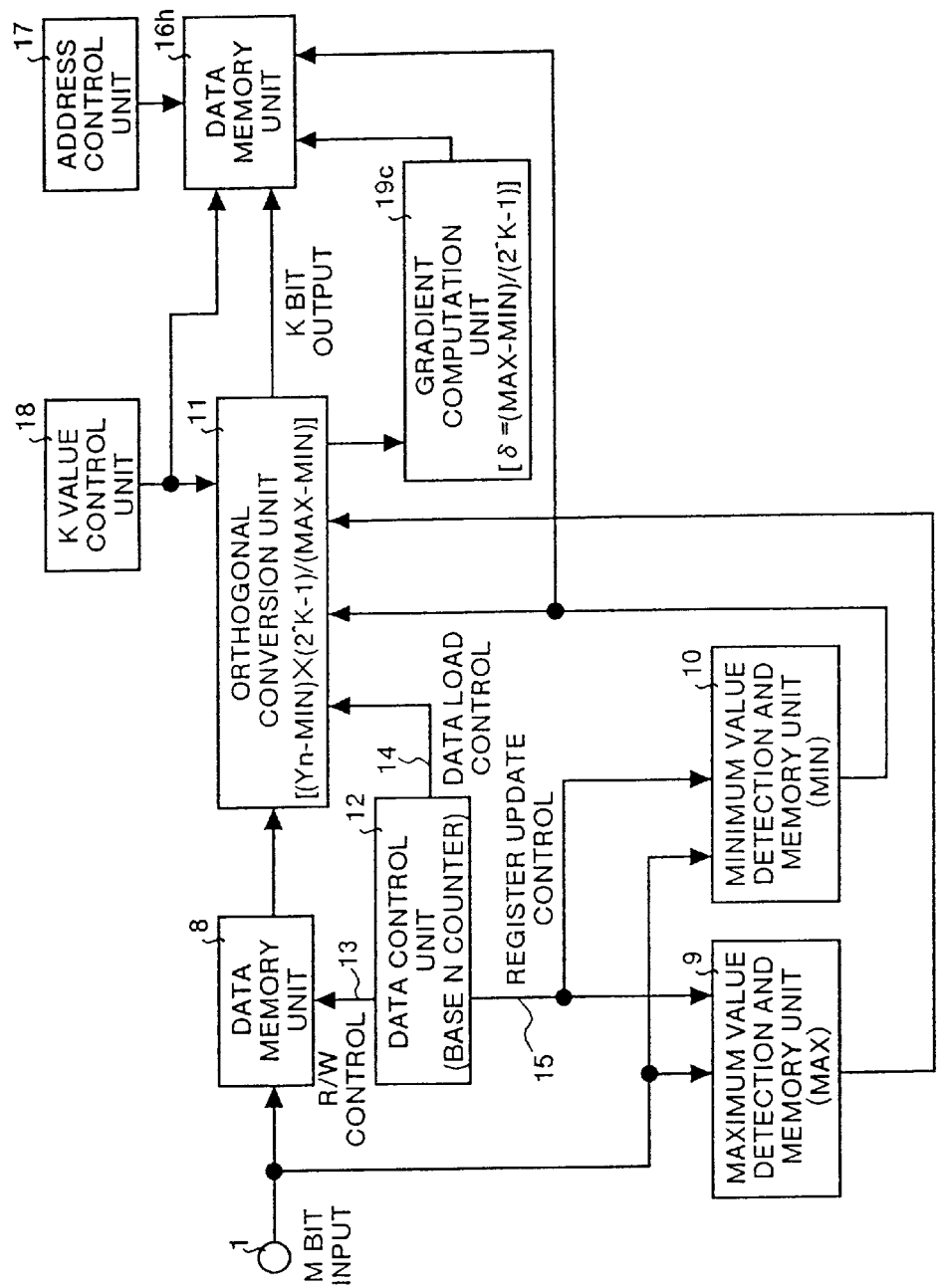
FIG. 13 is a block diagram showing a coding device according to a twelfth embodiment.

FIG. 13 shows a coding device according to the twelfth embodiment.

The present embodiment differs from the one shown in FIG. 1 in that it comprises a data memory unit 16h, capable of storing MIN values, K values, a gradient δ calculated by (MAX−MIN)/($2^K$−1), and computation values Xn of N samples coded in K bits for each block in a given number L of blocks, an address control unit 17 for controlling the memory addresses of the data memory unit 16h, a gradient computation unit 19c for calculating the gradient δ using the computation (MAX−MIN)/($2^K$−1), and a K value control unit 18 for controlling the K value of each block.

MIN1, K1, and gradient δ1 obtained by the computation (MAX1−MIN1)/($2^K$−1), for the data of the first block (i.e. the data group of the first N sample) are stored in the data memory unit 16h at an address specified by the address control unit 17, and computation values Xn of the N samples ($1 \leq n \leq N$) are coded in K bits using the equation (1) mentioned above by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced. In addition, it is possible to change the K value of each block, thereby making it easy to reduce and increase the number of data.

Figure 14:
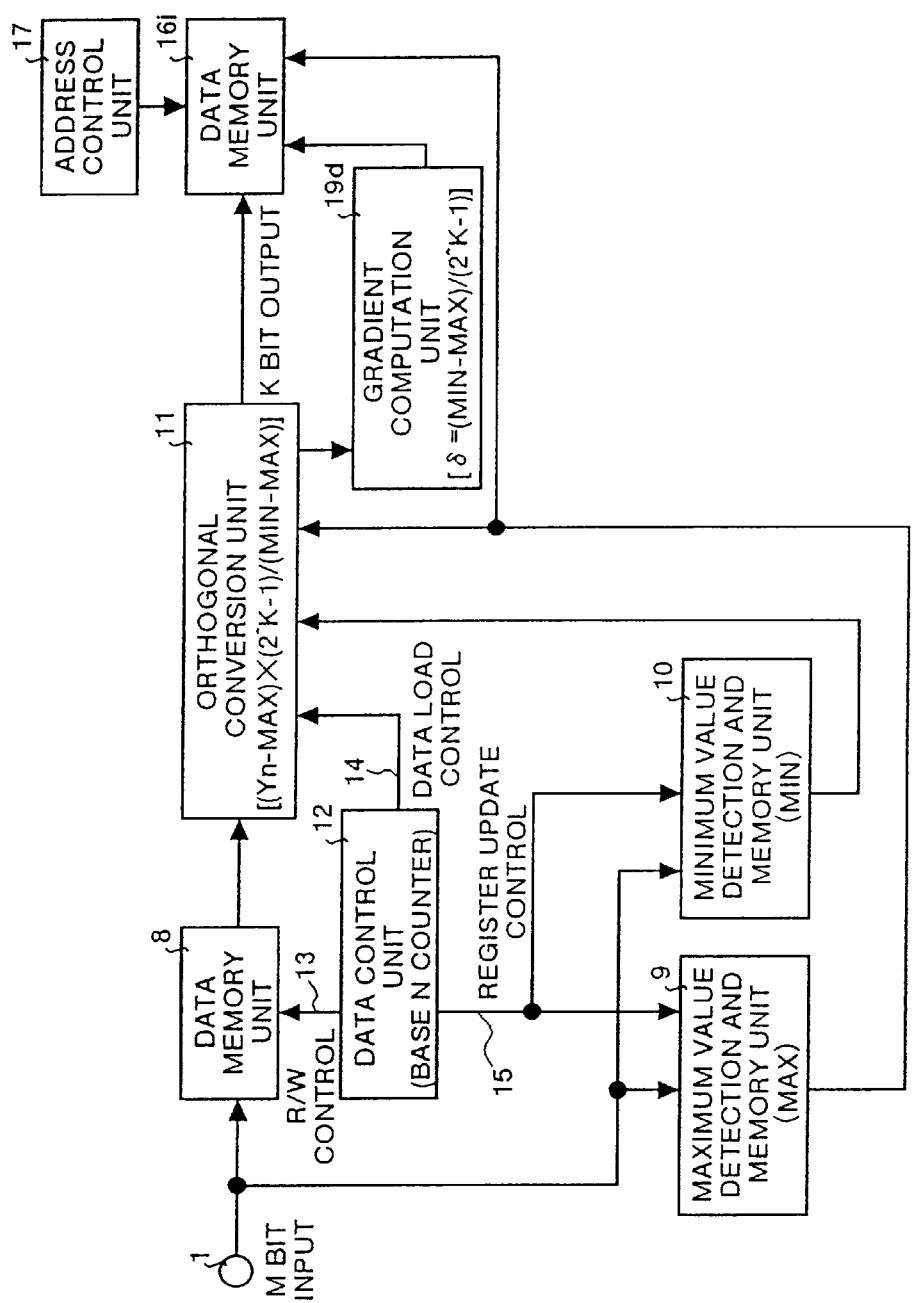
FIG. 14 is a block diagram showing a coding device according to a thirteenth embodiment.

FIG. 14 shows a coding device according to the thirteenth embodiment.

The present embodiment differs from the one shown in FIG. 1 in that it comprises a data memory unit 16i, capable of storing MAX values, a gradient δ calculated by (MIN−MAX)/($2^K$−1), and computation values Xn of N samples coded in K bits for each block in a given number L of blocks, an address control unit 17 for controlling the memory addresses of the data memory unit 16i, and a gradient computation unit 19d for calculating the gradient δ using the computation (MIN−MAX)/($2^K$−1).

A MAX1 and a gradient 61 obtained by the computation (MIN1 −MAX1)/($2^K$−1) for the data of the first block (i.e. the data group of the first N sample) are stored in the data memory unit 16i at an address specified by the address control unit 17, and computation values Xn of the N samples ($1 \leq n \leq N$) are coded in K bits using the equation (4) mentioned above by the orthogonal conversion computation unit 11 and are similarly stored sequentially at addresses specified by the address control unit 17.

When the first block (input data number N) ends, data is A similarly stored from the following second block to the L block.

With this constitution, data of L blocks can always be faithfully reproduced.

Figure 15:
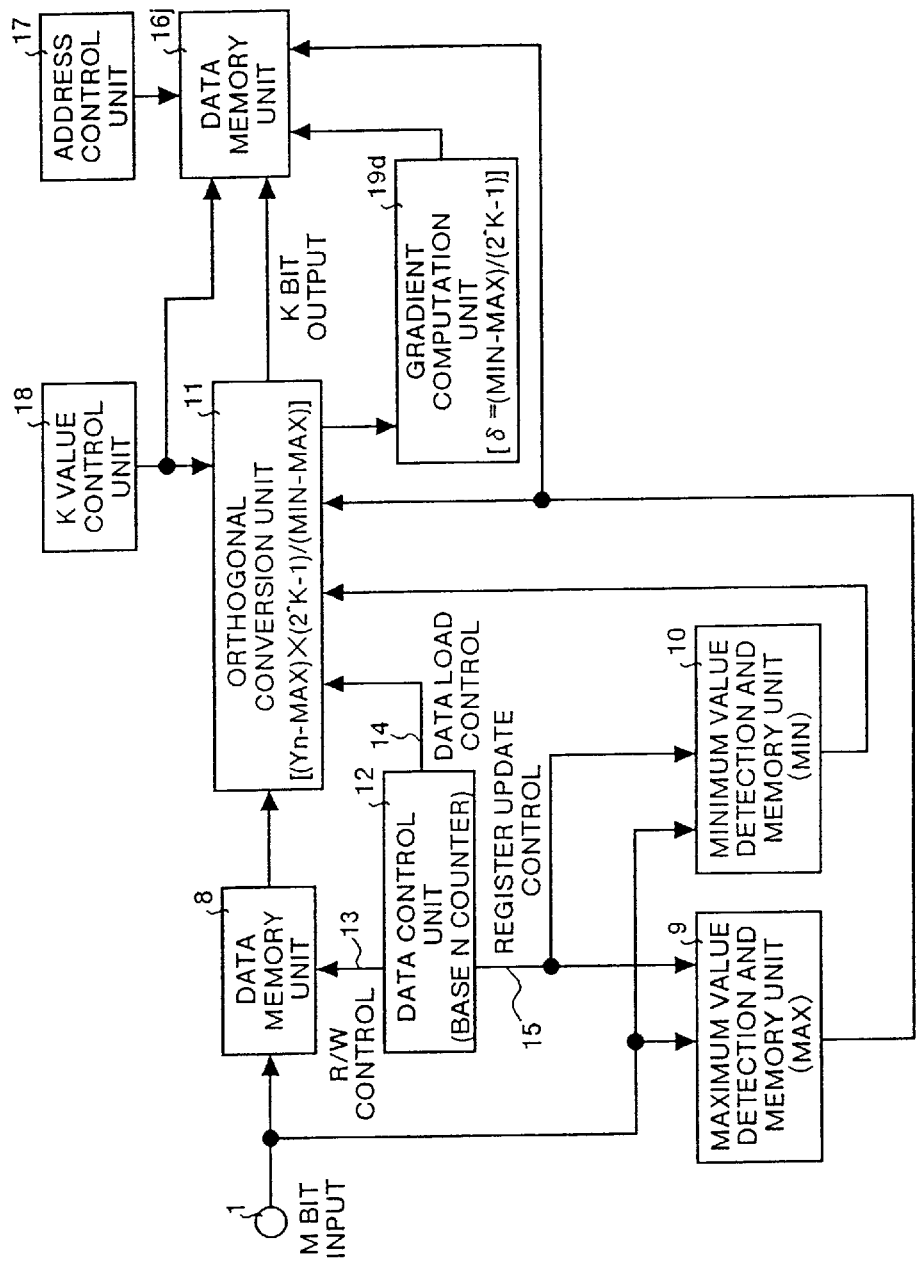
FIG. 15 is a block diagram showing a coding device according to a fourteenth embodiment.

FIG. 15 shows a coding device according to the fourteenth embodiment.

The present embodiment differs from the one shown in FIG. 1 in that it comprises a data memory unit 16j, capable of storing MAX values, K values, a gradient δ calculated by (MIN−MAX)/($2^K$−1), and computation values Xn of N samples coded in K bits for each block in a given number L of blocks, an address control unit 17 for controlling the memory addresses of the data memory unit 16j, a gradient computation unit 19d for calculating the gradient δ using the computation (MIN−MAX)/($2^K$−1), and a K value control unit 18 for controlling the K value of each block.

MAX1, K1, and gradient δ1 obtained by the computation (MIN1−MAX1)/($2^K$−1), for the data of the first block (i.e. the data group of the first N sample) are stored in the data memory unit 16j at an address specified by the address control unit 17, and computation values Xn of the N samples ($1 \leq n \leq N$) are coded in K bits using the equation (4) mentioned above by the orthogonal conversion computation unit 11 and are similarly stored sequentially at addresses specified by the address control unit 17.

When the first block (input data number N) ends, data is similarly stored from the following second block to the L block.

With this constitution, data of L blocks can always be faithfully reproduced. In addition, it is possible to change the K value of each block, thereby making it easy to reduce and increase the number of data.

Figure 16:
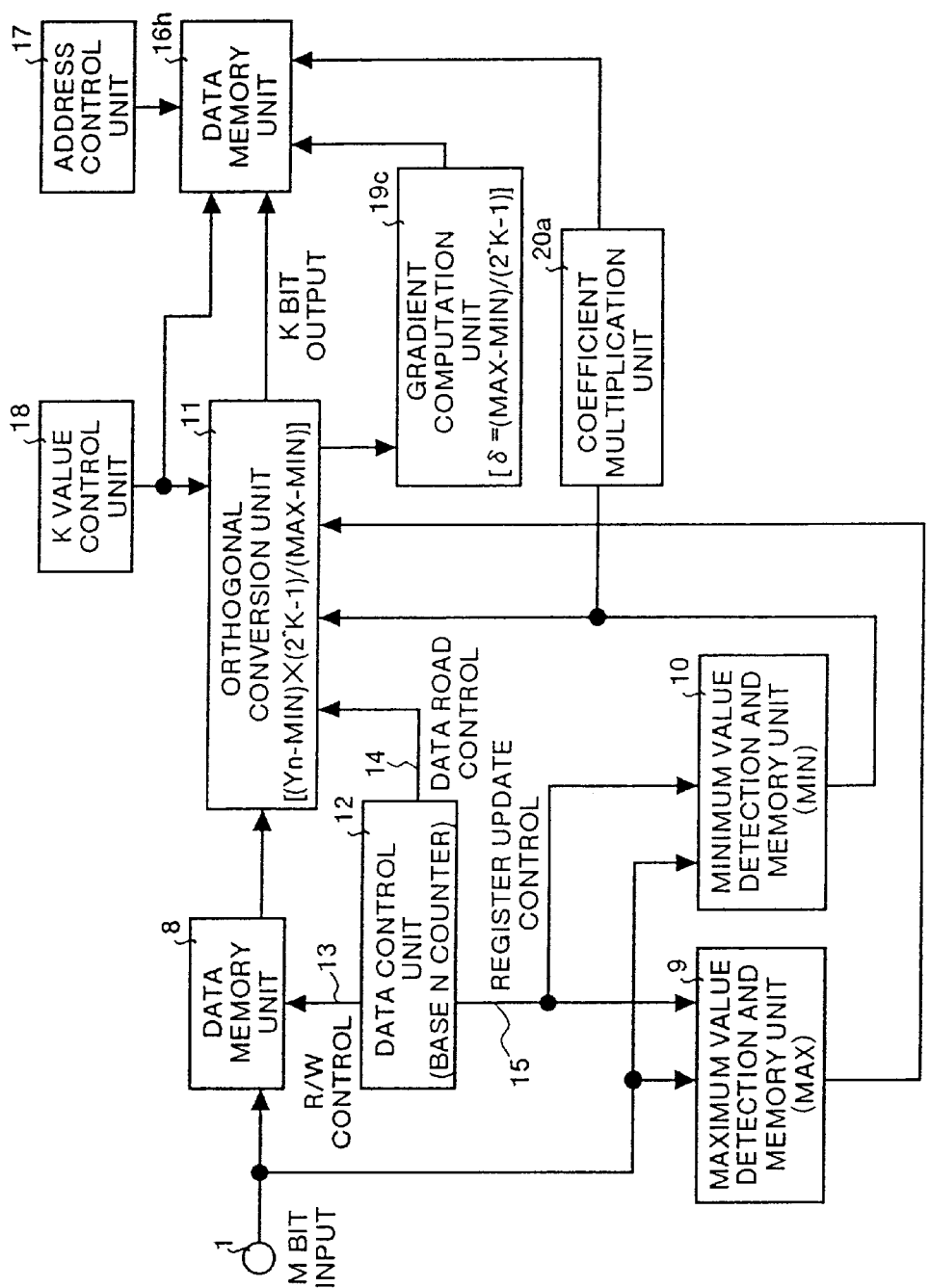
FIG. 16 is a block diagram showing a coding device according to a fifteenth embodiment.

FIG. 16 shows a coding device according to the fifteenth embodiment.

The coding device shown in FIG. 16 differs from the one shown in FIG. 13 in that it further comprises a coefficient multiplication unit 20a for multiplying the minimum value MIN by a desired coefficient, and the result of this multiplication is stored in the data memory unit 16h.

The operation is that, when the MIN value is for instance −8231, fifteen bits are needed to express this value in straight PCM. However, when the number of bits is lowered by for instance three bits, a MIN value of −1028.875 is obtained by setting the coefficient of the coefficient multiplication unit 20a to ⅛. When this value is rounded off to the first decimal place to form a whole number, the MIN value is −1029, which can be expressed with twelve bits in straight PCM.

That is, according to the constitution of the fifteenth embodiment, the amount of data can be increased and reduced by a desired amount.

Figure 17:
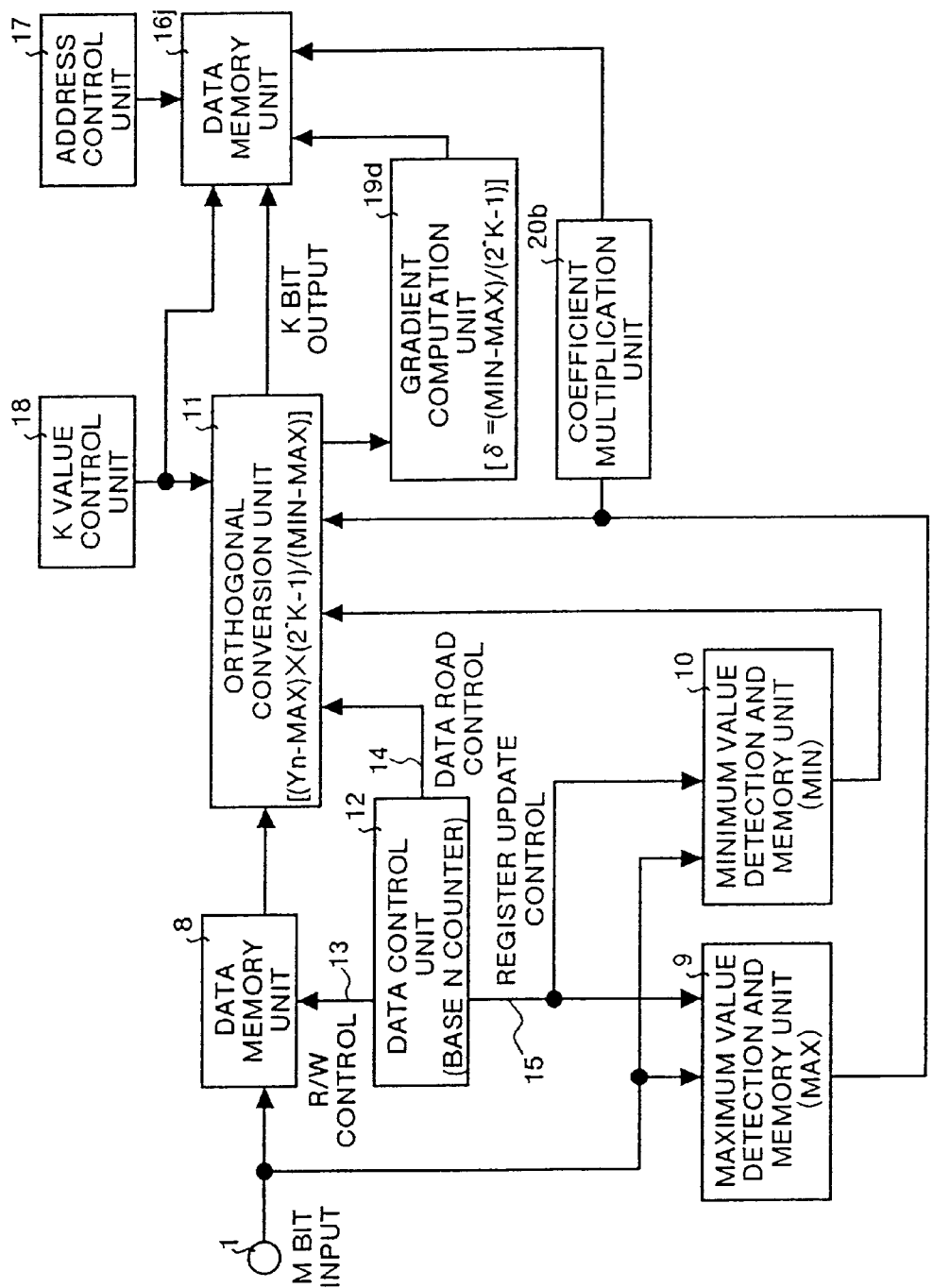
FIG. 17 is a block diagram showing a coding device according to a sixteenth embodiment.
Figure 18:
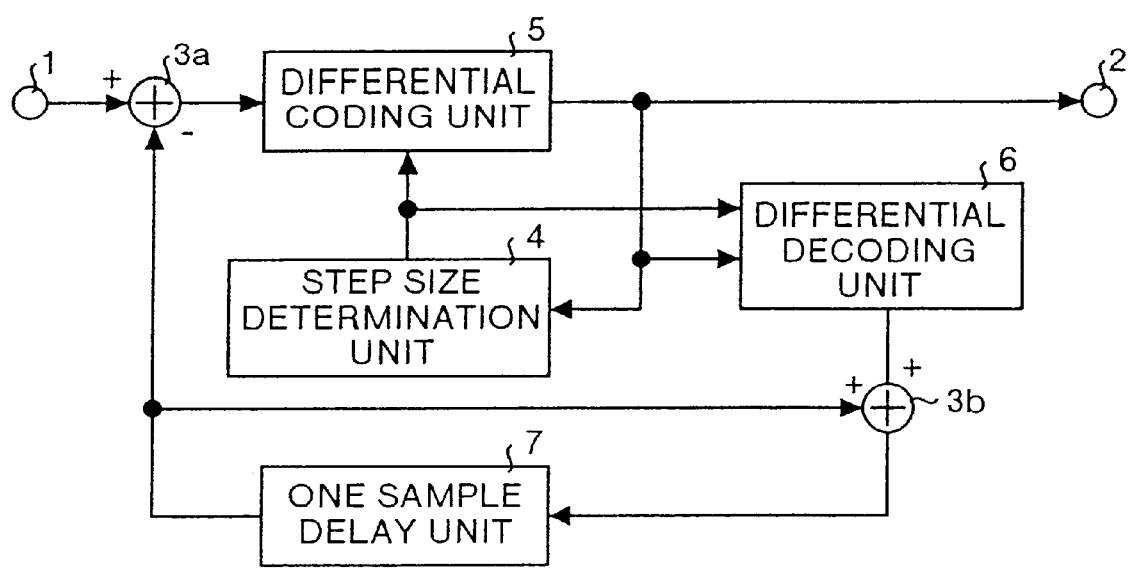
FIG. 18 is a block diagram showing a conventional coding device.

FIG. 17 shows a coding device according to the sixteenth embodiment.

The coding device shown in FIG. 17 differs from the one shown in FIG. 15 in that it comprises a coefficient multiplication unit 20b for multiplying the maximum value MAX by a desired coefficient, and the result of this multiplication is stored in the data memory unit 16j.

The operation is that, when the MAX value is for instance 8231, fifteen bits are needed to express this value in straight PCM. However, when the number of bits is lowered by for instance three bits, a MIN value of 1028.875 is obtained by setting the coefficient of the coefficient multiplication unit 20b to ⅛. When this value is rounded off to the first decimal place to form a whole number, the MIN value is 1029, which can be expressed with twelve bits in straight PCM.

That is, according to the constitution of the sixteenth embodiment, the amount of data can be increased and reduced by a desired amount.

Since it has the constitution described above, the present invention achieves the following effects.

In the coding device according to the first to seventh embodiments of the present invention, input data is arranged into blocks, a maximum value MAX and a minimum value MIN in that block are determined, and the data is coded after an orthogonal conversion computation unit has subtracted the differential value of the maximum value MAX and the minimum value MIN from the input data. Consequently, coding can be achieved without overload distortion.

In the coding device according to the eighth to seventeenth embodiments, coding can be achieved without overload distortion, as in the first to seventh embodiments, and in addition, data can always be faithfully reproduced since data of desired blocks are stored in memory.

Furthermore, in the coding device according to the ninth, eleventh, thirteenth, fifteenth, and seventeenth embodiments, the amount of data can be freely increased and decreased by changing the K value of each block.

In the coding device according to the eighteenth and nineteenth embodiments, coding can be achieved without overload distortion, as in the first to seventh embodiments, and in addition, the amount of data can be freely increased and decreased, since values obtained by multiplying the maximum value MAX and the minimum value MIN by a desired coefficient have been stored in memory.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A coding device comprising:
   a first data memory unit which stores a desired N samples of digital data comprising desired M bits;
   a maximum value detection unit which detects a maximum value MAX from the N samples of data;
   a maximum value memory unit which stores the maximum value MAX detected by said maximum value detection unit;
   a maximum value reading unit which reads out the maximum value MAX from said maximum value memory unit;
   a minimum value detection unit which detects a minimum value MIN from the N samples of data;
   a minimum value memory unit which stores the minimum value MIN detected by said minimum value detection unit;
   a minimum value reading unit which reads out the minimum value MIN from said minimum value memory unit;
   a data reading unit which reads out a desired data value Yn stored in said first data memory unit;
   an orthogonal conversion computation unit which calculates a value Xn based on the desired data value Yn and the difference of the maximum value MAX and the minimum value MIN; and
   a coding unit for coding the calculated value Xn obtained by said orthogonal conversion computation unit into desired K bits.

2. The coding device according to claim 1, wherein said maximum value memory unit specifies a position at which a maximum value is stored in said first data memory unit, thereby functioning as maximum value specification unit.

3. The coding device according to claim 1, wherein said minimum value memory unit specifies a position at which a minimum value is stored in said first data memory unit, thereby functioning as minimum value specification unit.

4. The coding device according to claim 1, wherein said orthogonal conversion computation unit calculates the value Xn using the equation $(Yn-MIN) \times (N-1)/(MAX-MIN) = Xn$.

5. The coding device according to claim 4, further comprising a second data memory unit which stores the minimum values MIN, data obtained by coding the value Xn into K bits, and a gradient $\delta$ calculated using the equation $\delta = (MAX-MIN)/(N-1)$, in a desired number L of blocks, one block comprising the N samples of data.

6. The coding device according to claim 4, further comprising a second data memory unit which stores the minimum values MIN, data obtained by coding the value Xn into K bits, K values, and a gradient $\delta$ calculated using the equation $\delta = (MAX-MIN)/(N-1)$, in a desired number L of blocks, one block comprising the N samples of data; and a K value control unit which controls the K value.

7. The coding device according to claim 1, wherein said orthogonal conversion computation unit calculates the value Xn using the equation (Yn−MAX)×(N−1)/(MIN−MAX)=Xn.

8. The coding device according to claim 7, further comprising a second data memory unit which stores the maximum values MAX, data obtained by coding the value Xn into K bits, and a gradient δ calculated using the equation δ(MIN−MAX)/(N−1), in a desired number L of blocks, one block comprising the N samples of data.

9. The coding device according to claim 7, further comprising a second data memory unit which stores the maximum values MAX, data obtained by coding the value Xn into K bits, K values, and a gradient δ calculated using the equation δ=(MIN−MAX)/(N−1), in a desired number L of blocks, one block comprising the N samples of data; and a K value control unit which controls the K value.

10. The coding device according to claim 1, wherein said orthogonal conversion computation unit calculates the value Xn using the equation (Yn−MIN)×($2^K$−1)/(MAX−MIN)=Xn.

11. The coding device according to claim 10, further comprising a second data memory unit which stores the minimum values MIN, data obtained by coding the value Xn into K bits, and a gradient δ calculated using the equation δ=(MAX−MIN)/($2^K$−1), in a desired number L of blocks, one block comprising the N samples of data.

12. The coding device according to claim 11, wherein a value obtained by multiplying the minimum value MIN by a desired coefficient set in advance is stored as the minimum value MIN in said second data memory unit.

13. The coding device according to claim 10, further comprising a second data memory unit which stores the minimum values MIN, data obtained by coding the value Xn into K bits, K values, and a gradient δ calculated using the equation δ=(MAX−MIN)/($2^K$−1), in a desired number L of blocks, one block comprising the N samples of data; and a K value control unit which controls the K value.

14. The coding device according to claim 1, wherein said orthogonal conversion computation unit calculates the value Xn using the equation (Yn−MAX)×($2^K$−1)/(MIN−MAX)=Xn.

15. the coding device according to claim 14, further comprising a second data memory unit which stores the maximum values MAX, data obtained by coding the value Xn into K bits, and a gradient δ calculated using the equation δ=(MIN−MAX)/($2^K$−1), in a desired number L of blocks, one block comprising the N samples of data.

16. The coding device according to claim 15, wherein a value obtained by multiplying the maximum value MAX by a desired coefficient set in advance is stored as the maximum value MAX in said second data memory unit.

17. The coding device according to claim 13, further comprising a second data memory unit which stores the maximum values MAX, data obtained by coding the value Xn into K bits, K values, and a gradient δ calculated using the equation δ=(MIN−MAX)/($2^K$−1), in a desired number L of blocks, one block comprising the N samples of data; and a K value control unit which controls the K value.

18. The coding device according to claim 1, further comprising a second data memory unit which stores the maximum value MAX, the minimum value MIN, and data obtained by coding the value Xn into K bits, in a desired number L of blocks, one block comprising N samples of data.

19. The coding device according to claim 1, further comprising a second data memory unit which stores the maximum values MAX, the minimum values MIN, data obtained by coding the value Xn into K bits, and K values, in a desired number L of blocks, one block comprising N samples of data, and a K value control unit which controls the value of K.

* * * * *